United States Patent
Mozak et al.

(10) Patent No.: US 9,009,540 B2
(45) Date of Patent: Apr. 14, 2015

(54) MEMORY SUBSYSTEM COMMAND BUS STRESS TESTING

(71) Applicants: Christopher P. Mozak, Beaverton, OR (US); Theodore Z. Schoenborn, Portland, OR (US); James M. Shehadi, Portland, OR (US); David G. Ellis, Tualatin, OR (US); Tomer Levy, Tel Aviv (IL); Zvika Greenfield, Kfar Sava (IL)

(72) Inventors: Christopher P. Mozak, Beaverton, OR (US); Theodore Z. Schoenborn, Portland, OR (US); James M. Shehadi, Portland, OR (US); David G. Ellis, Tualatin, OR (US); Tomer Levy, Tel Aviv (IL); Zvika Greenfield, Kfar Sava (IL)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 13/706,196

(22) Filed: Dec. 5, 2012

(65) Prior Publication Data

US 2014/0157055 A1 Jun. 5, 2014

(51) Int. Cl.
*G06F 11/00* (2006.01)
*G06F 11/263* (2006.01)
*G11C 29/02* (2006.01)
*G11C 29/06* (2006.01)
*G11C 29/52* (2006.01)

(52) U.S. Cl.
CPC .............. *G06F 11/263* (2013.01); *G11C 29/02* (2013.01); *G11C 29/025* (2013.01); *G11C 29/06* (2013.01); *G11C 29/52* (2013.01)

(58) Field of Classification Search
CPC .................................................. G06F 11/263
See application file for complete search history.

(56) References Cited

U.S. PATENT DOCUMENTS

| | | | | |
|---|---|---|---|---|
| 5,271,020 A | * | 12/1993 | Marisetty | 714/746 |
| 5,282,272 A | * | 1/1994 | Guy et al. | 710/116 |
| 5,373,535 A | | 12/1994 | Ellis et al. | |
| 5,394,557 A | | 2/1995 | Ellis | |
| 5,410,664 A | | 4/1995 | Brooks et al. | |
| 5,416,807 A | | 5/1995 | Brady et al. | |
| 5,436,927 A | | 7/1995 | Brady et al. | |
| 5,696,940 A | | 12/1997 | Liu et al. | |
| 5,809,038 A | | 9/1998 | Martin | |
| 6,191,713 B1 | | 2/2001 | Ellis et al. | |
| 6,307,806 B1 | * | 10/2001 | Tomita et al. | 365/233.1 |
| 6,553,525 B1 | | 4/2003 | Shephard, III | |
| 6,747,471 B1 | | 6/2004 | Chen et al. | |
| 6,826,100 B2 | | 11/2004 | Ellis et al. | |
| 6,839,288 B1 | * | 1/2005 | Kim et al. | 365/189.05 |
| 6,944,806 B2 | | 9/2005 | Flynn et al. | |
| 7,117,416 B1 | | 10/2006 | Fox | |
| 7,139,957 B2 | | 11/2006 | Querbach et al. | |
| 7,178,076 B1 | | 2/2007 | Zarrineh et al. | |
| 7,203,872 B2 | | 4/2007 | Frodsham et al. | |
| 7,260,759 B1 | | 8/2007 | Zarrineh et al. | |

(Continued)

FOREIGN PATENT DOCUMENTS

WO   WO 2013/002789 A1   1/2013

*Primary Examiner* — Charles Ehne
(74) *Attorney, Agent, or Firm* — Blakely, Sokoloff, Taylor & Zafman LLP

(57) ABSTRACT

A memory subsystem includes logic buffer coupled to a command bus between a memory controller and a memory device. The logic buffer detects that the memory controller places the command bus in a state where the memory controller does not drive the command bus with a valid executable memory device command. In response to detecting the state of the command bus, the logic buffer generates a signal pattern and injects the signal pattern on the command bus after a scheduler of the memory controller to drive the command bus with the signal pattern.

30 Claims, 12 Drawing Sheets

(56) References Cited

U.S. PATENT DOCUMENTS

| | | |
|---|---|---|
| 7,313,712 B2 | 12/2007 | Cherukuri et al. |
| 7,366,964 B2 | 4/2008 | Frodsham et al. |
| 7,415,032 B2 | 8/2008 | Drottar et al. |
| 7,464,307 B2 | 12/2008 | Nejedlo et al. |
| 7,681,093 B2 | 3/2010 | Frodsham et al. |
| 7,711,878 B2 | 5/2010 | Cherukuri et al. |
| 7,743,176 B1 | 6/2010 | Turney et al. |
| 7,746,795 B2 | 6/2010 | Frodsham et al. |
| 7,886,174 B2 | 2/2011 | Spry et al. |
| 7,957,428 B2 | 6/2011 | Steinman et al. |
| 8,195,996 B2 | 6/2012 | Frodsham et al. |
| 8,225,151 B2 | 7/2012 | Rajeev et al. |
| 8,250,416 B2 | 8/2012 | Frodsham et al. |
| 8,331,176 B2 | 12/2012 | Mozak et al. |
| 8,819,474 B2 | 8/2014 | Schoenborn et al. |
| 2002/0003049 A1 | 1/2002 | Dabral et al. |
| 2004/0117708 A1 | 6/2004 | Ellis et al. |
| 2004/0153850 A1 | 8/2004 | Schoenborn et al. |
| 2004/0218440 A1 | 11/2004 | Kumar et al. |
| 2005/0262184 A1 | 11/2005 | Cherukuri et al. |
| 2007/0220378 A1 | 9/2007 | Mamileti et al. |
| 2011/0161752 A1 | 6/2011 | Spry et al. |
| 2013/0031281 A1 | 1/2013 | Feehrer et al. |
| 2014/0026005 A1 | 1/2014 | Roohparvar et al. |
| 2014/0032826 A1 | 1/2014 | Lee et al. |

\* cited by examiner

MEMORY SUBSYSTEM COMMAND BUS STRESS TESTING

FIELD

Embodiments of the invention are generally related to memory subsystems, and more particularly to providing deterministic memory testing.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2012, Intel Corporation, All Rights Reserved.

BACKGROUND

Memory devices find ubiquitous use in electronic devices, such as in consumer electronics. Memory devices are typically used to store executable code and data for the runtime operation of the electronic device. Many electronic devices stay operating almost continuously for long periods of time, potentially transferring large amounts of data in and out of the memory devices. Thus, it is important that the memory devices perform according to design expectations. However, memory devices are subject to failure from design issues or manufacturing inconsistencies. The failures can show up right after manufacturing as well as in operation of the devices.

Memory testing is used to detect abnormalities or other unexpected behavior in the memory devices. Some errors relate to the operation of the memory subsystem with respect to storing and transferring data. Other errors relate to the operation of the memory subsystem with respect to commands. Errors related to memory device commands are more difficult to test, due to a greater difficulty in creating conditions to create the errors in command processing by the memory device.

Creating high-stress command bus patterns can be difficult due to the need to maintain protocol compliance. Test data for the data bus can be of any value, making it fairly straightforward to generate a wide variety of high stress patterns. In contrast, the command bus has restrictions on the values that can be assigned to the individual lanes of the command bus. The protocol requirements of the different command bus lanes means that an attempt to drive random values to the memory device will likely violate a memory device signaling/interconnection protocol, resulting in an error (e.g., reading from a location that has not yet been activated).

Thus, traditional memory subsystem tests could not create data with sufficiently high-stress patterns on the command bus. Among other missing testing capabilities, traditional tests have been unable to control patterns during various cycles of the command bus. Additionally, there have been problems trying to synchronize or integrate test data with real data on the command bus.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
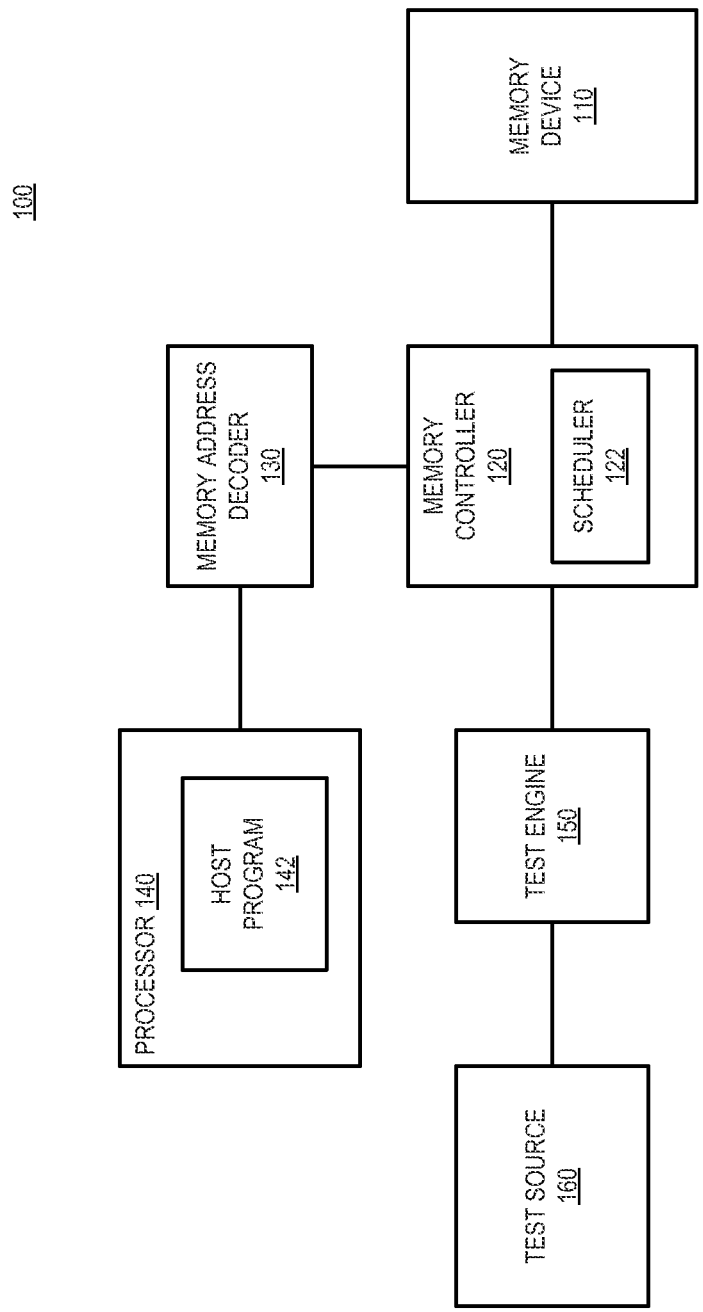
FIG. 1 is a block diagram of an embodiment of a system having a test engine that provides testing on a transaction level.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem includes a logic buffer coupled to a command bus between a memory controller and a memory device. The logic buffer detects that the memory controller places the command bus in a state where the memory controller does not drive the command bus with a valid executable memory device command. Such a state can be referred to as a deselect cycle. It will be understood that the state of the command, and the state of each channel of the command bus can change on a cycle by cycle basis, where the memory controller drives a valid command on one cycle and not another (e.g., driving a NOP or deselect cycle). In response to detecting the state of the command bus, the logic buffer generates a signal pattern and injects the signal pattern on the command bus after a scheduler of the memory controller to drive the command bus with the signal pattern. The logic buffer as described herein can generate high-stress command bus patterns without violating memory device interface specifications (i.e., compliant with protocol(s)). The signals can be injected without changing the nature of the command; thus, for example, a deselect command will remain a deselect command but have the test signal injected into it. Thus, the signal patterns could be understood as carefully created deselect commands. Additionally, signals can be injected during select cycles and NOPs in a similar manner without affecting the overall nature of the command.

By passing a signal pattern onto the command bus after the scheduler when the bus is placed in a state where the memory controller will not drive it with a command, test traffic can be placed on the command bus. In one embodiment, the individual lanes of the command bus can be selectively controlled with data to provide test signal patterns. For example, the logic buffer can receive a command, and insert data into one of the fields not in use on a particular command. Alternatively, or additionally, the logic buffer can generate a command when there is no valid command on the bus. Thus, in one embodiment, the logic buffer can inject a signal pattern into part or all of a command bus. The command bus can be thought of as individual lanes of the various signals on the command bus. For example, DDR (dual data rate) memory devices can include RAS (row address select (also called row address signal or row address strobe)), CAS (column address select (also called column address signal or column address strobe)), WE (write enable), MA (memory address), BA (bank address), CS (chip select), ODT (on die termination), and CKE (clock enable). Each "lane" refers to the one or more signal lines of the physical layer that interconnect the memory controller to the memory device.

Each lane has definite requirements based on the protocol, which generally prevents being able to randomly drive values to the memory device. Random values driving the lanes would likely violate the specifications for signaling and interconnecting, and would also likely not do anything useful or provide meaningful testing. The principal way commonly used to test memory devices is to write data into memory and then read it back to check if the data was written correctly. As a result, any command test would need to be sure the data had been written to memory before trying to read it. The testing as provided herein ensures that data is written before being read, as well as not aliasing address bits by writing a second value to a given address before the first value is read. A valid test will also conform to the memory device protocol, for example, by opening a page before reading or writing to the page, and, for example, obeying all timing specifications.

The logic buffer, in one embodiment a command/address data buffer (CADB) including logic, is located after the memory controller on the command/address bus. In one embodiment, a test engine is located prior to the memory controller to test data and commands by injecting memory access transactions into the memory controller. The logic buffer can supplement testing by injecting signal patterns into scheduled commands after a scheduler of the memory controller.

In one embodiment, the logic buffer uses a "deselect" approach to test the command bus without violating protocol. Memory device protocols or standards can define certain states of the command bus where part or all of the command bus will be ignored by the memory device. Despite ignoring the specific command (by not executing it), the memory device will still process the command to determine whether it should be executed, which can test the command bus. For example, in DDR protocols, the memory devices ignore commands where a particular chip select signal (CS#) is high. DDR protocols also define a NOP (RAS#=CAS#=WE#=1), which causes the memory device to not perform any operations in response to the command. Similar, comparable, and/or other states can be defined in other protocols where the command bus is in a state where all or a portion of the command bus does not include a valid executable command. A state defined by asserted or deasserting a combination of signals can limit stress traffic from using those signal lanes. In general all such states can be referred to herein as a "deselect cycle," including when a chip select is deselected, a NOP signal is asserted, or other condition where part or all of the command bus is not driven with valid command or address data.

When the memory device is configured to ignore commands on the command bus during these conditions, the memory controller or a test device (such as a logic buffer or CADB) can drive anything in these cycles without violating protocol. Thus, the signal patterns injected by the logic buffer during such cycles will not directly cause failures since the memory devices will not execute them, the signal patterns can be used to create crosstalk and ISI (inter-symbol interference) that can cause failures on real "select" cycles, or real commands placed on the bus by the memory controller. In one embodiment, the logic buffer runs in parallel to a test engine, coordinated with the data sent by the test engine, to test both writes and/or reads to memory while the also filling in gaps on the command bus with worst case traffic.

With reference to a test engine that can operate in conjunction with or in parallel with the logic buffer described herein, the test engine as described herein can inject transactions (e.g., read, write, maintenance command) directly into the memory controller, bypassing a memory address decoder. Passing the transactions to the memory controller after the memory address decoder enables the test engine to operate at the level of specific memory address (e.g., rank, bank, row, and column) and create precisely targeted tests that focus on specific locations in the memory device. However, because the test engine operates on the transaction level, the test operations (embodied in the transactions created) still go through the normal memory controller and scheduler. The memory controller generates specific memory device commands from the transactions.

In one embodiment, consider that a transaction indicates to read a cacheline from memory. Depending on the current state of memory, such a read may require a given page of memory to be precharged, a new page activated based on the row address of the read command, and the actual read command to be issued. The precharging, activating, and reading is supposed to take place with the appropriate timing per a memory protocol for the memory device. In another embodiment, consider that a transaction indicates a read where the appropriate page in memory is already open, which may only require a read command to the appropriate column to access the data. In general, the memory access transactions indicate to the memory controller what to do, but not how to do it. The memory controller controls tracking the current state of memory and how to access a location based on the current state of memory. Thus, the memory controller determines how to Activate and/or Precharge the proper pages, issue appropriate CAS/RAS commands, and obey all relevant timing related to accessing the memory device.

By operating at the transaction level and allowing the memory controller to generate the memory device commands and timing, the testing is easier to write, and yet at the same time more accurately reflects how the memory subsystem operates (it is "correct by construction"). The test engine cannot do anything that the memory controller would not normally do, or request the memory device to perform an operation that would be considered illegal under access protocol(s). Such capability is in contrast to both the traditional software testing and hardware FSMs used in testing. The "correct by construction" nature of the test engine described herein gives increased confidence that any failures detected by the test engine are real failures and not simply the result of incorrect test setup.

In one embodiment, the test engine is configured by software to output a specific sequence of transaction, walking through different address ranges with write and/or read transactions. The software can be run either locally at the host device in which the memory controller and memory device are found (e.g., through a core or microcontroller on the platform) or remotely (e.g., by a remote host via a debug port). In one embodiment, the test engine supports both local and remote software execution to provide a test instruction. Remote host testing can provide remote validation during debug or during post-manufacturing testing. Local testing can be performed for self-testing purposes, for example, by a BIOS (basic input/output system) or operating system (OS) verification software. In one embodiment, the testing could be used by BIOS to optimize the performance of the command bus in the specific system. For example, the BIOS can center the clock in the middle of the command eye, center a VrefCA used to distinguish a 1 from a 0 on the command bus, and/or optimize transmitter/receiver behavior for a given system.

As described herein, the test engine is deterministic and controllable. The determinism can be further leveraged by the logic buffer described herein. In one embodiment, the test engine is dynamically controllable. The determinism refers to an expectation that repeatedly running the same test will generate exactly the same sequence of activity on the memory command bus and data bus in a cycle-accurate manner. The controllability refers to being able to control the behavior of the system with precision (e.g., causing specific behavior at specific cycles). The test engine creates different memory conditions with the transactions created and passed to the memory controller. In one embodiment, the test engine enables support to synchronize with power down modes, refreshes, ZQ calibration, and maintenance commands. The synchronization can enable the test engine to place the memory controller in a deterministic state prior to starting a test. In one embodiment, the test engine can reset all or part of the memory controller, by resetting one or more counters or setting the counters to a programmable value.

In one embodiment, the test engine is dynamically configurable, which can allow it to test for multiple different worst case scenarios to more fully validate I/O performance in the memory subsystem. The test engine can provide specific patterns that test specific cases of memory device circuit marginality. Thus, the test engine can create precisely targeted, high bandwidth tests. In one embodiment, the test engine can generate multiple test signals in parallel to send to the memory controller to have the memory controller schedule and test multiple different regions of memory at the same or substantially the same time. For example, certain test engine transactions can generate commands for different areas of memory that are sent out by the memory controller before the testing of the other area is completed.

The test engine as described herein can be used to test memory devices. Any memory subsystem that uses a memory controller with a scheduler or equivalent logic can implement at least one embodiment of the test engine. Similarly, a logic buffer or equivalent component as described herein can be configured to work with any memory subsystem that uses a memory command bus to send memory device commands. Reference made herein to memory devices can include different memory types. For example, memory subsystems commonly use DRAM, which is one example of a memory device as described herein. Thus, the test engine described herein is compatible with any of a number of memory technologies, such as DDR4 (dual data rate version 4, specification in development as of the filing of this application), LPDDR4 (low power dual data rate version 4, specification in development as of the filing of this application), WIDEIO (specification in development as of the filing of this application), and others.

It will be understood that in a memory device, rows that are physically adjacent can often be logically labeled differently from one manufacturer to another. Similarly, columns that are physically adjacent can be logically labeled differently from one manufacturer to another. Typically a manufacturer maps logically adjacent rows and columns of memory by a physical address offset, and the offsets can be different among different manufacturers. The offsets are not necessarily the same for rows and columns. For example, an N-bit address can be used to access a particular row of the memory. In the simplest case, the adjacent row can be accessed by toggling AddressBit[0]. However, in other implementations, the memory device can be physically organized differently such that AddressBit[x] indicates the adjacent row. In still other implementations, a combination of several bits is combined in a hashing function to find the adjacent row. By providing bit swizzling and hashing functions in the hardware, the test engine can remap the logical test engine address to a physical memory device addresses to ensure the test is accessing the physical adjacent rows and/or columns for tests that rely on row/column adjacency. Accessing the array in a specific order based on physical organization may be critical to finding certain classes of failures.

The memory device itself is configured to determine how to map access requests to the physical memory resources. Memory controllers are generally designed to be compatible with many different types of memory devices, and so they are generally not designed specifically with respect to any particular manufacturer's device. Thus, memory controllers do not traditionally have logic or information to indicate what rows or columns are physically adjacent. In one embodiment, the test engine can be configured with logic that takes into account the specific offsets of a particular memory device. In one embodiment, the test engine can be specific to a particular memory device. In one embodiment, the test engine can be generic with respect to multiple different memory devices.

FIG. 1 is a block diagram of an embodiment of a system having a test engine that provides testing on a transaction level. System 100 includes components of a memory subsystem (memory device 110, memory controller 120, and memory address decoder 130) coupled to a test engine (coupled to memory controller 120) and a host processor (coupled to memory address decoder 130). Test engine 150 enables deterministic memory testing in system 100. In one embodiment, test engine 150 is implemented in the same hardware (e.g., in the same die space) as memory controller 120.

Memory device 110 represents any type of memory device with addressable memory locations. Memory address decoder 130 receives a memory access request from processor 140, and determines a specific memory address to fulfill the request. It will be understood that processor 140 may not be directly coupled to memory address decoder 130. However, access requests in system 100 are generally created by processor 140, and pass through memory address decoder 130 for resolution of a specific physical location of memory device 110 as identified by a specific address. Host program 142 represents any one or more software processes executed by processor 140 from which a memory access request can be generated. In one embodiment, processor 140 is a graphic processor, a video display processing component, or a processing component that receives data or instructions from a device external to system 100. Thus, host program 142 can include agents or processes that create memory access transactions that are not necessarily executed by a host processor.

Memory address decoder 130 generates memory access transactions to fulfill the access requests. Memory controller 120 receives the memory access transactions and determines what specific memory device commands to execute to comply with protocol and design configuration of memory device 110 to fulfill the access requests. Memory controller 120 schedules the specific memory device commands with scheduler 122. In one embodiment, memory controller 120 performs out-of-order scheduling, which means that memory access transactions can be resolved into multiple memory device commands, and executed in an order selected by memory controller 120 instead of an order in which they are passed by memory address decoder 130. Memory address decoder 130 can potentially generate the transactions out of order from the requests received from host processor 140. Thus, there is no guarantee of the order of execution of memory access requests made through memory address decoder 130.

Test engine 150 bypasses memory address decoder 130 and generates transaction-level access requests for memory controller 120 to schedule. It will be understood that test engine 150 does not bypass the scheduling path of memory controller 120. Like memory address decoder 130, test engine 150 generates and passes memory access transactions with specific addresses.

Test engine 150 receives one or more memory test instructions or software commands from test source 160. Test source 160 can be any sources of a number of different sources. For example, in the case of a production-level test or during debugging, a test fixture or other external (which can also be referred to as remote) processor or system can send a test instruction via a debug port or other interface to test engine 150. The external system can be referred to as a remote test administrator system, including a processor to issue the instructions. Alternatively, test source 160 could be a microcontroller local to a host computing platform of system 100 (e.g., a "motherboard" or other platform on which processor 140 and its peripheral interfaces reside). Test source 160 could be a test system coupled to a peripheral bus of system 100. In one embodiment, test source 160 is a BIOS of system 100.

In one embodiment, test engine 150 is configurable to execute different memory tests. Thus, test source 160 can provide one or more instructions to cause test engine 150 to generate one or more transactions consistent with one memory test, and then provide one or more different instructions to cause test engine 150 to generate one or more transactions consistent with a different memory test. Responsive to receiving a software command from test source 160, test engine 150 generates the one or more transactions to execute a test indicated by test source 160. Test engine 150 passes the transaction to memory controller 120, which in turn, schedules one or more memory device commands to memory device 110. Memory device 110 will thus carry out the transaction provided by test engine 150.

In one embodiment, test engine 150 is implemented as a hardware finite state machine (FSM). Test engine 150 can be a dynamically programmable hardware FSM. The ability of test engine 150 to provide deterministic testing via the transaction-level testing enables running various different test scenarios. Examples of different test cases can include the following.

In one embodiment, test engine 150 performs a turnaround time test. A turnaround time test detects issues related to how long it takes the system to switch at speed between different physical devices of the memory. For example, if commands are issued too close together, a new command can corrupt a command already on the line that has not been fully received and processed by the target device. In one embodiment, test engine 150 allows for walking across a programmable sequence of ranks and/or banks Walking across the sequence allows testing of different combinations of read and/or writes to different ranks, while hitting all combinations of turnarounds. In one embodiment, test engine 150 tests minimum specified turnaround times to provide the highest stress timing that schedule 122 allows.

Table 1 illustrates one example of an embodiment of a test sequence that walks across all ranks in a system with four ranks, hitting various combinations of write-write or read-read. Such a test can test, for example, different DIMM turnarounds. Different combinations may be of interest for different failure modes under test. It will be understood that the test operates from left to right, and could be extended out further to the right. While write-write and read-read combinations are illustrated, similar sequences are possible for write-read and/or read-write. In one embodiment, test engine 150 walks across ranks in a linear order (referred to as a logical rank), and is consistent in walking across the same logical rank. Thus, test engine can walk across all ranks in a logical order. In one embodiment, test engine 150 includes a fully programmable mapping between the logical rank and physical rank, which enables it to issue transactions targeted to desired physical memory locations. It will be understood that scheduler 122 sees the physical ranks, but would typically not see the logical rank. Test engine 150 can thus cover an arbitrary sequence of ranks in a memory test. It will be understood that a similar test could be programmed to provide a physical bank mapping, which can map between logical bank and physical bank. Thus, the test engine could perform a walk-through test on a sequence of banks.

TABLE 1

Example turnaround testing with logic rank

| Rank Order | 0 | 2 | 1 | 3 | 0 | 3 | 1 | 2 | | | | | | | | |
|---|---|---|---|---|---|---|---|---|---|---|---|---|---|---|---|---|
| Operation | W | W | W | W | W | W | W | W | R | R | R | R | R | R | R | R |
| Rank | 0 | 2 | 1 | 3 | 0 | 3 | 1 | 2 | 0 | 2 | 1 | 3 | 0 | 3 | 1 | 2 |
| Turnaround | | 01 | 21 | 13 | 30 | 03 | 31 | 12 | | 01 | 21 | 13 | 30 | 03 | 31 | 12 |

In one embodiment, part of generating the memory test includes performing a logical-to-physical address mapping, mapping the logical address. The logical-to-physical address mapping can include logical column address to a physical column address, logical row address to physical row address, logical rank address to physical rank address, logical bank address to physical bank address, or a combination of these. The mapping can be achieved via swizzling different bits, combining multiple bits together in a hashing function, the use of a fully programmable mapping table on all or a subset of the bits, or some other mechanism to map addresses.

In one embodiment, test engine 150 performs a power down mode test. In one embodiment, test engine 150 provides the ability to insert a programmable wait time at any point during a test. By adjusting the wait time and scheduler parameters, test engine 150 can enable memory controller 120 to enter all possible power down modes including APD (automatic power down), PPD (precharged power down), Self-Refresh, and/or other internal power down modes such as package C-states. Thus, test engine 150 can target testing to cover entering and exiting power down modes with the most aggressive possible timing, while also providing programmable traffic around the enter and/or exit.

In one embodiment, test engine 150 performs a refresh test. In one embodiment, test engine 150 injects periodic refreshes into scheduler 122 as needed to either maintain memory device cell contents, or to create worst case power supply noise. The refreshes consume significant dI/dt or current surges, which is known to cause power supply noise. Test engine 150 can inject the refreshes at a deterministic, programmable time relative to the start of the test. In one embodiment, test engine 150 can cover different types of refreshes as supported by memory device 110 (for example, some memory device specifications allow per bank refreshes, or all rank refreshes, as well as others).

In one embodiment, test engine 150 performs a test of ZQ calibration. In one embodiment, test engine 150 can inject periodic ZQ calibration commands into scheduler 122 as needed to maintain the ZQ compensation and/or test any potential issues with variation in the termination resistor calibration of memory device 110. Test engine 150 can inject ZQ calibration commands at a deterministic, programmable time relative to the start of the test. In one embodiment, test engine 150 can cover different types of ZQ calibration as supported by a specification of memory device 110 (for example, long versus short).

In one embodiment, test engine 150 performs a register test, such as a Mode Register write (MRW) or a Mode Register read (MRR). In one embodiment, test engine 150 can inject mode register writes and/or reads into scheduler 122 to cover any possible combination of these commands with other commands. Providing register transactions from test engine 150 can also provide coverage for functional modes that may require doing register read and/or write commands.

In one embodiment, test engine 150 performs an error recovery test. It will be understood that because test engine 150 passes access transactions to memory controller 120 to be scheduled by scheduler 122, error recovery in system 100 will occur as in runtime operation of system 100. Thus, in the case of an error, such as parity error or CRC (cyclic redundancy check) error in memory device 110, scheduler 122 can respond as in operation, such as retrying transactions.

It will be understood that the different tests for ZQ calibration, registers, power down, or error recovery can be combined with other types of tests, as well as with each other. Other test scenarios are possible. In general, test engine 150 can enable full testing of the I/O for training (e.g., I/O performance, memory power), electrical validation, system validation, and/or self-test or repair (e.g., I/O or memory cell).

Figure 2:
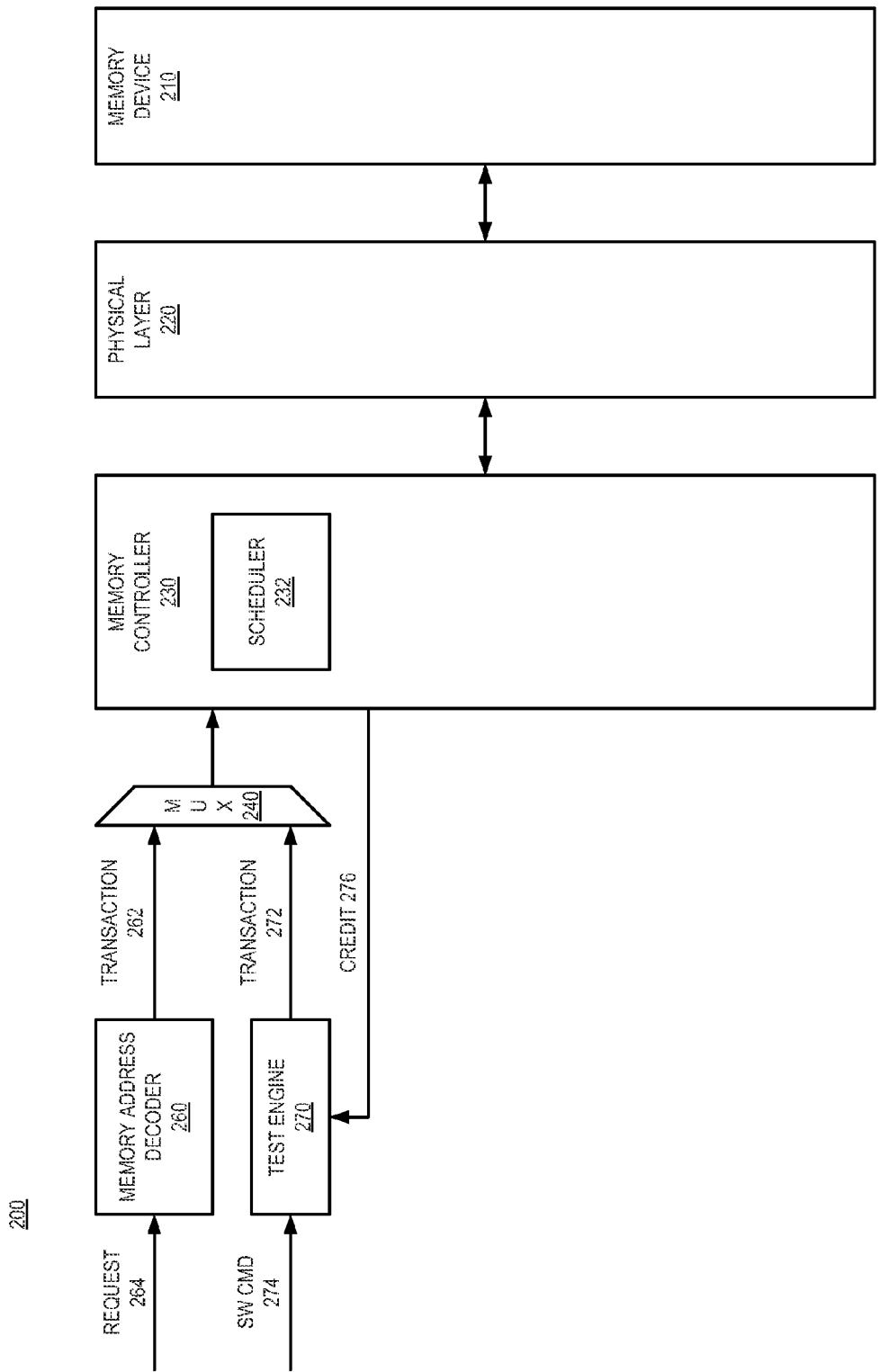
FIG. 2 is a block diagram of an embodiment of a system having a test engine that provides transaction-level testing multiplexed to a memory controller with a memory address decoder.

FIG. 2 is a block diagram of an embodiment of a system having a test engine that provides transaction-level testing multiplexed to a memory controller with a memory address decoder. System 200 is one example of an embodiment of a system with a test engine in accordance with any embodiment described herein, such as system 100 of FIG. 1. Memory device 210 stores data and/or instructions for execution by a processor (not specifically shown). The operation of memory device 210 is tested by test engine 270.

Physical layer 220 provides the architecture to connect multiple memory devices 210 to memory controller 230. Physical layer 220 can include registers, physical buses, and other components of a memory device that handle I/O (input/output) to/from memory device 210. For example, physical layer 220 can include components of a dual inline memory module (DIMM), which can include multiple individual DRAMs.

Memory controller 230 is a memory controller in accordance with any embodiment described herein, and includes scheduler 232. Memory controller 230 generates memory device commands for memory device 210 to execute. Scheduler 232 schedules the memory device commands generated in response to the memory access transactions received at memory controller 230.

Memory address decoder 260 provides a standard path for memory requests to reach memory controller 230, for example, from a host processor. Memory address decoder 260 receives request 264 from a source such as the host processor. Request 264 generally includes an access command and address information. The address can be a logical address, which does not identify the actual physical address of the memory location(s) to which the memory access is directed. Memory address decoder 260 includes logic that enables it to resolve the physical address from the virtual address information to create transaction 262. In one embodiment, transaction 262 includes a command identifier, and identifies the specific rank, bank row, and column for the command.

System 200 includes test engine 270, which receives software command 274 from a test source, and generates memory access transactions 272 for scheduling by memory controller 230 and execution by memory device 210. In one embodiment, transactions 272 are of the same form as transactions 262, with a command identifier (e.g., a read identifier or write identifier), and identifier for the specific rank, bank row, and column for the command. In one embodiment, memory controller 230 generates credit 276 as feedback to test engine 270. Memory controller 230 can use credit 276 to provide indicators of the timing of processing transaction 272. Thus, for example, memory controller 230 can indicate when a transaction has been processed.

In one embodiment, test engine 270 uses credit 276 to control the determinism of the testing. For example, test engine 270 can use a single credit policy in that it will only send out one transaction or command at a time. In one embodiment, test engine 270 waits to send out a subsequent transaction until memory controller 230 returns credit 276 indicating the first transaction has been issued. Thus, even if scheduler 232 uses out of order scheduling or just in time scheduling, test engine 270 can send one transaction at a time, which ensures that scheduler 232 will not reorder the test.

It will be understood that a credit return generally could be accomplished in different ways, depending on the memory controller architecture and specific sequences of transactions or commands. In one embodiment, memory controller 230 returns credit 276 after a Read or Write CAS command is generated. Alternatively, memory controller 230 can generate credit 276 from an Activate command, or other memory device command or internal scheduler event. Test engine 270 could simply wait a period of time between sending transactions, without the need for credit 276. However, in such an implementation a full bandwidth deterministic test of the memory device may not be possible.

In one embodiment, a sophisticated credit feedback mechanism is used between memory controller 230 and test engine 270. For example, feedback can be provided under certain circumstances for specific events (e.g., internal scheduler events), and/or feedback specific to a physical memory location (e.g., per rank), and/or some other mechanism. With a more sophisticated credit return policies, test engine 270 can generate transactions in parallel for different portions of the memory, or different conditions to affect memory device 210, and thus, provide a higher bandwidth test of memory device 210. Such a higher bandwidth test can test the highest possible memory bandwidth allowable by a specification for memory device 210 and/or allowable by the design or specification of memory controller 230.

In one embodiment, system 100 includes multiplexer 240 or equivalent logic (e.g., logic within memory controller 230) to select between transaction 262 of memory address decoder 260 or transaction 272 of test engine 270. Although the expression "multiplexed" may be used, it will be understood that if the operation of memory address decoder is temporarily suspended, and/or higher-level operations at the processor level are suspended to prevent issuing of memory access requests, transaction 272 can be the only input available during testing. Thus, in one embodiment, mux 240 can be implemented as a simple buffer that can be written by either memory address decoder 260 or test engine 270. Alternatively, mux 240 can be a multiplexer that selects between transaction 262 and transaction 272 responsive to a set signal (not explicitly shown). Such a signal could be generated, for example, by test engine 270 or an external signal controllable by the test source. In one embodiment, such a set signal could be used as a security feature to prevent access to the test engine by malicious code that could be trying to access protected memory contents through the test engine, which it would otherwise not have access to. Thus, selecting the multiplexer can be understood in one embodiment as providing security to the test engine.

Figure 3:
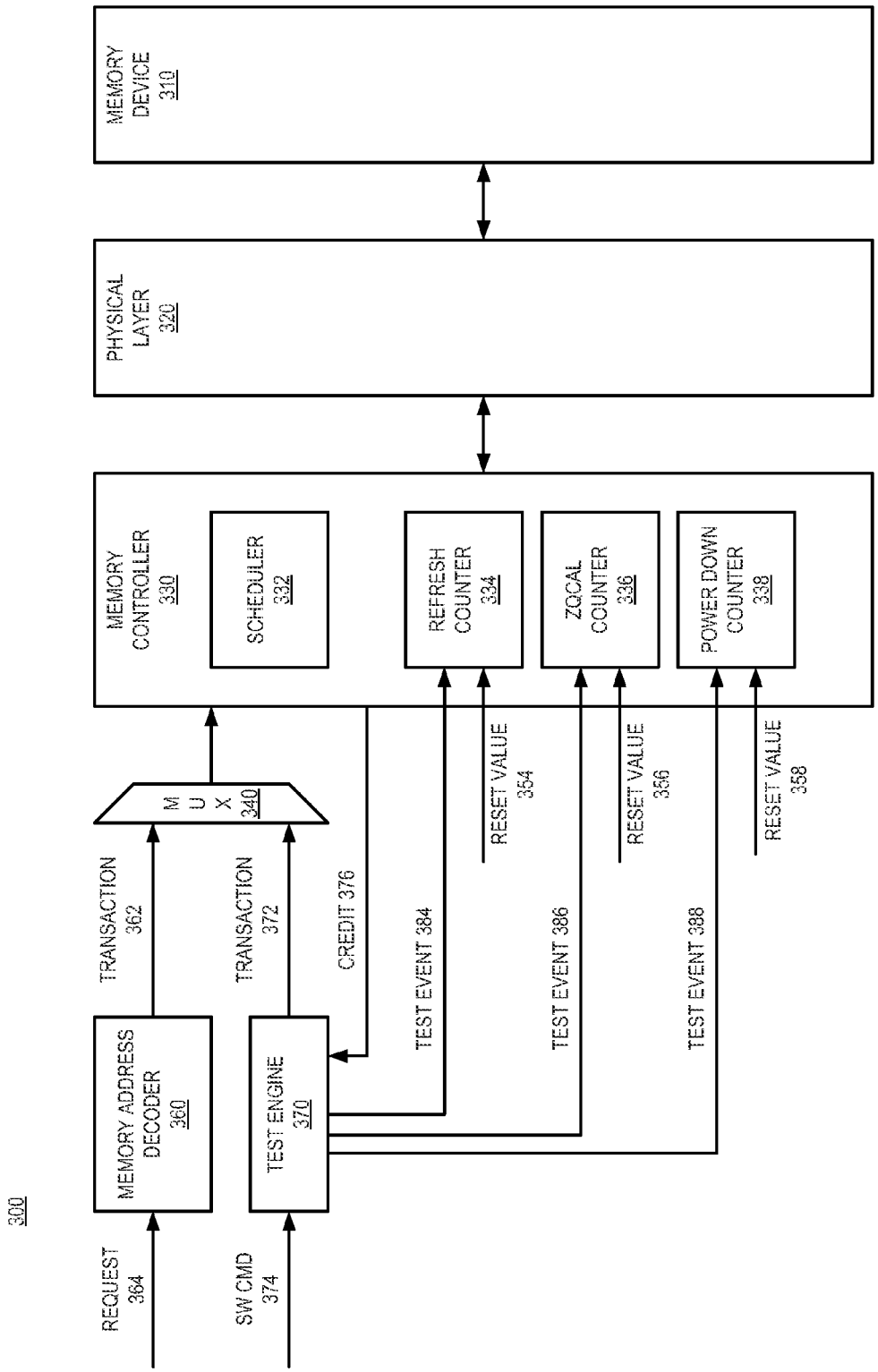
FIG. 3 is a block diagram of an embodiment of a system having a test engine that provides transaction-level testing including the ability to reset memory controller counters.

FIG. 3 is a block diagram of an embodiment of a system having a test engine that provides transaction-level testing including the ability to reset memory controller counters. System 300 is one example of an embodiment of a system with a test engine in accordance with any embodiment described herein, such as system 100 or system 200. Memory device 310 stores data and/or instructions for execution by a processor. The operation of memory device 310 is tested by test engine 370.

System 300 includes memory device 310, physical layer 320, memory address decoder 360, and test engine 370. Each component corresponds to a component of system 200, and the description above with respect to those components applies to system 300. In one embodiment, system 300 includes mux 340, which can be the same as mux 240 of system 200 discussed above. Memory address decoder 360 receives request 364, and generates transaction 362 in response to the request, where transaction 362 includes specific address information. Test engine 370 receives software command 374, and in response to the instruction generates one or more transactions 372. In one embodiment, system 300 utilizes credit 376 to provide feedback from memory controller 330 to test engine 370.

Memory controller 330 includes scheduler 332, which can be similar to scheduler 232 of system 200. Memory controller 330 can use credit 376 to provide indicators of the timing of processing transaction 372, and for example, can indicate when a transaction has been processed.

In one embodiment, memory controller 330 includes one or more counters. Examples include, but are not limited by, refresh counter 334, ZQCal counter 336, and power down counter 338. In one embodiment, test engine 370 performs a reset of memory controller 330 in conjunction with a memory test. The reset can include resetting all counters of memory controller 330, or can include selectively resetting certain counters. In one embodiment, test engine 370 generates a reset in response to an event from within test engine 370, such as part of a test, or in response to a condition detected by test engine logic. In one embodiment, test engine 370 generates a reset of the memory controller in response to an event in memory controller 330, such as the execution of a command, or the occurrence of an alert, interrupt, error, or other condition.

Refresh counter 334 represents a counter that controls timing for performing a refresh of one or more memory resource of memory device 310. ZQCal counter 336 represents a counter that controls a configuration of a termination resistor. Power down counter 338 represents a counter that controls timing related to a power down event. It will be understood that not only could there be other counters, there can be multiples of each counter type (e.g., multiple power down counters).

In one embodiment, test engine 370 provides reset control of refresh counter 334 via test event 384, control of ZQCal counter 336 via test event 386, and control of power down counter 338 via test event 388. It will be understood that each of test events 384, 386, and 388 could be the same test event. For example, test engine 370 could generically reset all counters when it is to reset one counter for a specific memory test. Test events 384, 386, and 388 could be signals provided directly from test engine 370. In one embodiment, one or more test events 384, 386, and 388 are signal provided by scheduler 332. Both test engine 370 and scheduler 332 can generate test events based on test synchronization requirements and ease of implementation.

Generally resetting of a counter is thought of as resetting the counter to zero. In one embodiment, one or more of the counter are reset to a programmable reset value specific to the counter and/or specific to a particular test or test event. Thus, reset value 354 is shown as an input to refresh counter 334, reset value 356 is shown as an input to ZQCal counter 336, and reset value 358 is shown as an input to power down counter 338. It will be understood that reset values 354, 356, and 358 could alternatively be replaced with programmable delays on a corresponding test event signal (test events 384, 386, and 388, respectively). Thus, if specific test event signals are used for the different counters, test engine 370 could simply control when a reset is generated for a specific counter to produce a desired value at a specific point in the test. Alternatively, the counter can be reset and then set to a specific non-zero counter value.

Figure 4:
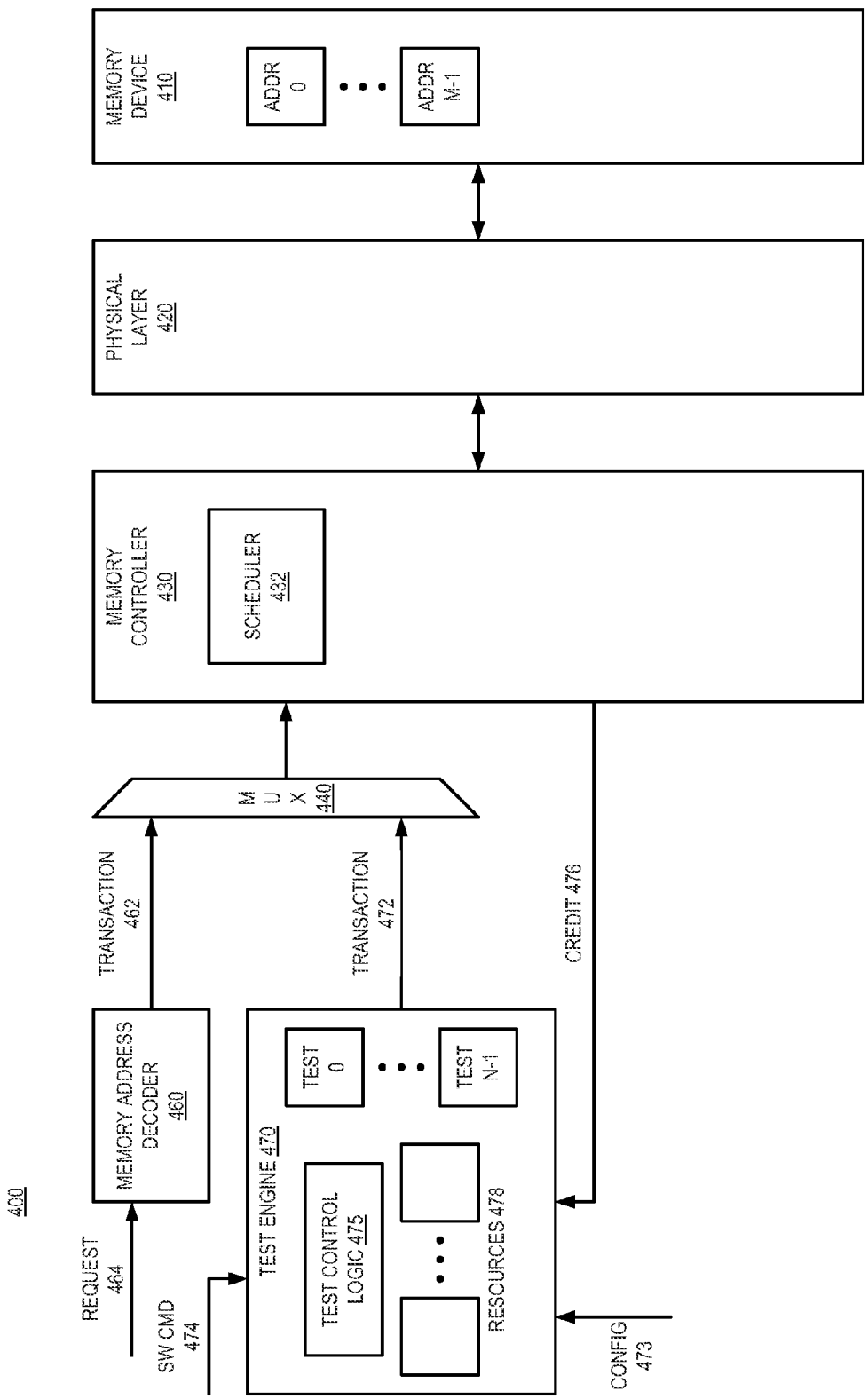
FIG. 4 is a block diagram of an embodiment of a system having a test engine with configurable hardware resources that provides transaction-level testing.

FIG. 4 is a block diagram of an embodiment of a system having a test engine with configurable hardware resources that provides transaction-level testing. System 400 is one example of an embodiment of a system with a test engine in accordance with any embodiment described herein, such as systems 100, 200, or 300. Memory device 410 stores data and/or instructions for execution by a processor. The operation of memory device 410 is tested by test engine 470.

System 400 includes memory device 410, physical layer 420, memory address decoder 460, and test engine 470. Each component corresponds to a component of system 200, and the description above with respect to those components applies to system 400. In one embodiment, system 400 includes mux 440, which can be the same as mux 240 of system 200 discussed above. Memory address decoder 460 receives request 464, and generates transaction 462 in response to the request, where transaction 462 includes specific address information. Test engine 470 receives software command 474, and in response to the instruction generates one or more transactions 472. In one embodiment, system 400 utilizes credit 476 to provide feedback from memory controller 430 to test engine 470.

Memory controller 430 includes scheduler 432, which can be similar to scheduler 232 of system 200. Memory controller 430 can use credit 476 to provide indicators of the timing of processing transaction 472, and for example, can indicate when a transaction has been processed.

In one embodiment, test engine 470 includes dynamically configurable hardware resources 478. For example, in one embodiment, test engine 470 includes one or more configurable/programmable logic arrays or configurable logic devices. It will be understood that configurable/programmable logic devices can be configured via software control. As mentioned above, the software control can be through a local device, or via a remote administration device. Thus, in one embodiment, configuration (config) 473 is provided by the test source that generates software command 474. In one embodiment, configuration 473 represents a setting of one or more registers or configuration controls in test engine 470, and software logic to program test engine resources 478 can come from a storage device (not shown).

Resource 478 can be used to implement any of a number of different tests, and the configuration of the resources can be different for the different tests, although some configuration settings may overlap between tests. In one embodiment, resources 478 are arranged to implement different FSMs in response to configuration 473.

Memory device 410 has memory elements (e.g., cells) with addresses ADDR0 through ADDR(M−1). The M addresses could be the range of all addresses in memory device 410, or alternatively could be a range less than the whole device over which a test sequence is to be iterated.

Test engine 470 is shown to include test0 through test(N−1). The N tests can represent different iterations through the same test (e.g., the same test transaction with N different addresses), in which case N and M could be considered equal. The N tests can represent N different tests that are each iterated through the M addresses. As illustrated, test engine 470 includes N different configurations of resources 478 to execute the N different tests. Configuration 473 is provided to configure the N different test setups of resources 478. In one embodiment, a single software command 474 operates to cause test engine 470 to generate M transaction 474 to iteratively test ADDR0 through ADDR(M−1). In one embodiment, multiple tests are generated and passed to the memory controller to be executed in parallel.

In one embodiment, the address range M can be decomposed further into {Rank[Ra−1:0], Bank[B−1:0], Row[R−1:0], Column[C−1:0]} starting and stopping addresses for a test, where the rank, bank, row, and column are understood to be of sizes Ra, B, R, and C, respectively. It will be understood that hardware can adjust the Row/Column/Bank range based on exact organization for each rank of memory device 410 (e.g., a 2 Gb DRAM will have a different number of rows than a 4 Gb DRAM). It will be understood that hardware can adjust the Rank range based on the exact system population (e.g., a system could be populated with single rank or quad rank DIMMs). In one embodiment, test engine 470 includes test control logic 475, which represents logic that enables test engine to modify its configuration based on configuration signal 473. Test control logic 475 manages the configuration of resources 478.

The setting value of {Rank, Bank, Row, Column} indicate specific addresses. In one embodiment, the addresses can be incremented by Rate and Value, which could each be signed numbers. In one embodiment, test engine 470 includes address increment logic (e.g., implemented in resources 478. The address increment logic can support various options. In one embodiment, test engine 470 via address increment logic can generate a test sequence where every Rate transactions, the address is incremented by Value. In one embodiment, test engine 470 via address increment logic can generate a test sequence where every Rate sequences or subsequences, the address is incremented by Value. In one embodiment, test engine 470 via address increment logic can generate a test sequence where a wrap on one subfield of the address can cause an increment on a different subfield. For example, when column reaches its stop point and wraps around, it could cause the row to increment. This can also be done in multiple dimensions to allow for more complex tests that walk along diagonals (for example, simultaneously incrementing both row and column).

In one embodiment, test engine 470 periodically inverts {Rank, Bank, Row, Column} at a programmable rate to stress the decoding logic of memory device 420 (e.g., decoding logic in physical layer 420). A test sequence can indicate a list of Subsequences enabled for a particular test, and a number of times to loop through the Subsequences. In one embodiment, test engine 470 includes logic to determine whether to use a fixed number of transactions, or base sequence transition on an address wrap.

In one embodiment, test engine 570 increments the {Rank, Bank, Row, Column} in a way that the address changes in a pseudo random fashion instead of a simple linear fashion while still covering the entire address range. In one embodiment, the counter could be replaced with a linear feedback shift register of the appropriate length to randomly change all the address bits on each increment. In another embodiment, more sophisticated random number generators could be utilized to provide better coverage of a wide variety of defects with a single test.

In one embodiment, a Subsequence defines how many transactions the Subsequence should perform. The Subsequence can also define what type of transaction the Subsequence should do, such as Base Read, Base Write, Base Read followed by a Write, Base Write followed by a Read, Offset Read, Offset Write, or other transaction type. In one embodiment, test engine 470 can generate one or more offset transactions, which apply an offset to a current {Rank, Bank, Row, Column} address. The offset can enable tests that stress the memory device cell at the current address by accessing nearby cells. For example, test engine 470 can apply a range of different offsets where the test will read all memory addresses within ±X rows of the current address. In one embodiment, test engine 470 can apply offsetting to multiple dimensions of the address, allowing for accesses within a programmable-sized hypercube of the current address.

It will be understood that test engine 470 can generate inverted data transactions based on a number of transactions or certain bits of the address. The use of inverted data transactions provides a simple way to create stripes or checkerboard data patterns useful in memory tests.

Figure 5A:
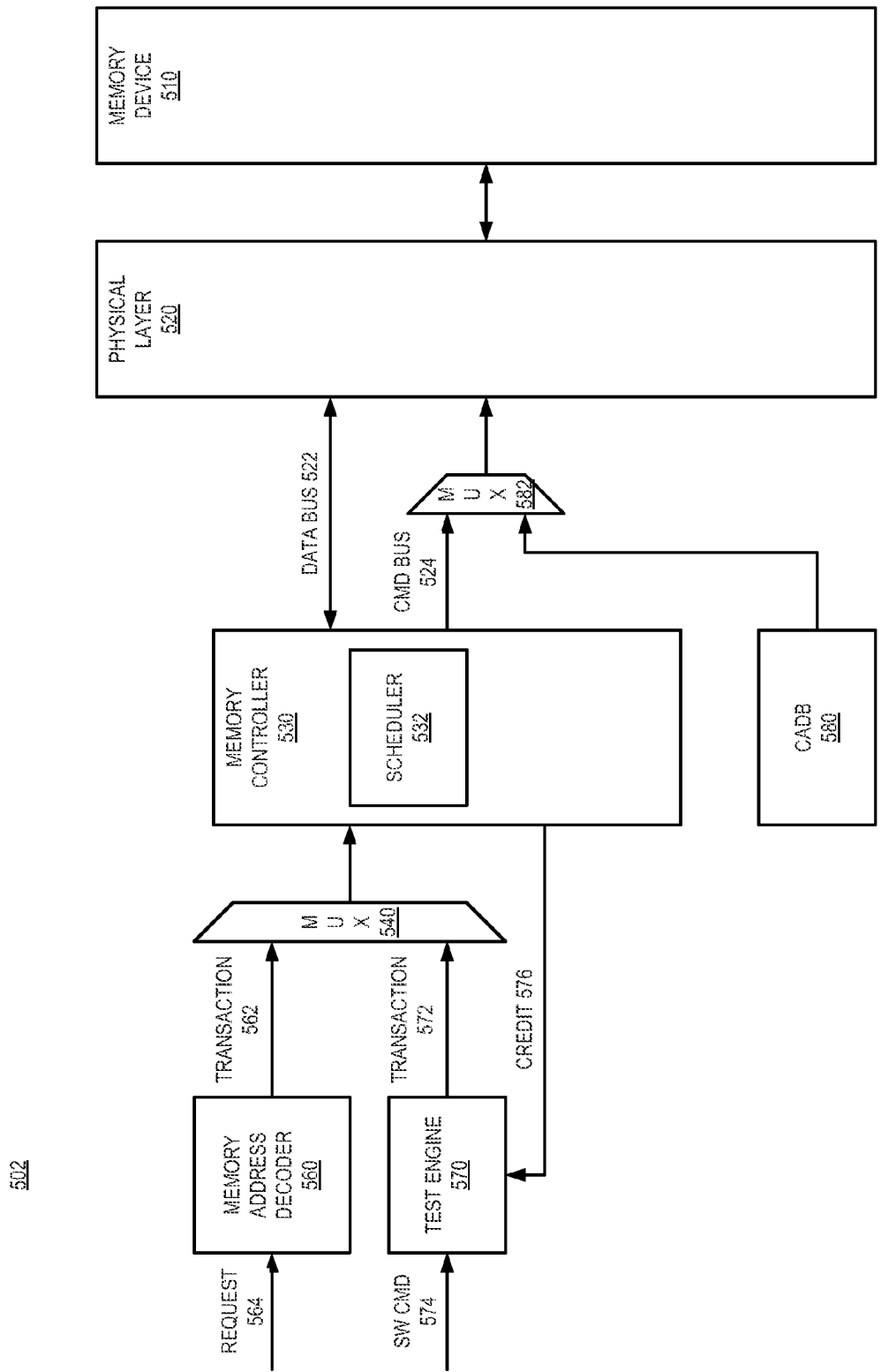
FIG. 5A is a block diagram of an embodiment of a system having a logic buffer coupled to the command bus to provide a signal pattern on the command bus.

FIG. 5A is a block diagram of an embodiment of a system having a logic buffer coupled to the command bus to provide a signal pattern on the command bus. System 502 is specifically shown including test engine 570, but test engine 570 is optional in one embodiment of system 502. Thus, it will be understood that CADB 580 can be used in system 502 with or without test engine 570. In an embodiment where test engine 570 is included, test engine 570 can be a test engine in accordance with any embodiment described herein. In one embodiment, system 502 is one example of a system in accordance with any embodiment of systems 100, 200, or 300, with or without a test engine.

Thus, memory device 510 stores data and/or instructions for execution by a processor. Physical layer 520 includes interconnections, registers, and other logic and physical interfaces between memory controller 530 and memory device 510. Memory controller 530 interfaces between a processor or other source of memory access requests (not specifically shown in system 502). Memory controller 530 processes and maps memory access requests to memory device commands executed by memory device 510 to access specific physical resources. Memory address decoder 560 receives request 564, maps the request to physical memory locations in transaction 562, and forwards the memory access transaction to memory controller 530 for processing and scheduling. In one embodiment, memory address decoder 560 is considered part of memory controller 530. In one embodiment, memory address decoder 560 is on the same die as memory controller 530.

In one embodiment, test engine 570 receives software commend 574 and generates memory access transactions 572 to simulate traffic to memory device 510. Transaction 572 can be controlled for specific access patterns and traffic load to perform tests on memory device 510. In one embodiment, test engine 570 is part of memory controller 530, and/or is on the same die as memory controller 530. Mux 540 can select between transactions 562 and 572 generated by memory address decoder 560 and test engine 570, respectively. Selection control of mux 540 can be controlled by a test administrator software command (not specifically shown), or by the test engine itself. Credit 576 represents synchronization feedback that memory controller 530 can provide to test engine 570. Memory controller 530 uses scheduler 532 to schedule (e.g., control ordering and timing of commands, implement an access protocol) memory device commands to send to memory device 510 (e.g., via physical layer 520).

In one embodiment, system 502 includes CADB 580, which represents one embodiment of a logic buffer or comparable logic/device that injects a signal pattern on a command bus after scheduler 532. Memory controller 530 is illustrated as having data bus 522 and command bus 524 between it and physical layer 520 and memory device 510. Data bus 522 represents a bus (group of signaling lines) over which data can be transferred between memory device 510 and memory controller 530. Command bus 524 represents a bus over which memory controller 530 provides memory device commands for memory device 510 to execute. The commands can be any command related to accessing data (e.g., read/write commands), accessing a data location (e.g., activate, refresh), accessing a register (e.g., setting/reading a Mode Register), or other commands.

Command bus 524 can be thought of as having multiple channels or lanes, as mentioned above. The various lanes can correspond to different operations in memory device 510, and each lane can have specific requirements for what data can be placed on the lane in what circumstances. For example, a command truth table associated with a memory device signaling standard can indicate what commands are triggered when, and what values to use in each lane to achieve the commands. Mux 582 represents a device that enables selectively combining or selecting commands from memory controller 530 (via scheduler 532) and commands from CADB 580 to send to memory device 510.

In one embodiment, CADB 580 is simply a buffer with selection logic, which can enable selecting and inserting values onto command bus 524. In one embodiment, CADB 580 includes logic to enable selectively generating command values to inject onto command bus 524. In one embodiment, mux 582 can be considered part of CADB 580. One example of an embodiment of a logic buffer with selection logic (e.g., mux 582), is described below with respect to FIGS. 7A and 7B.

In one embodiment, CADB 580 enables system 502 to create a variety of high stress patterns on command bus 524. It will be understood that even though it is not expressly labeled in the drawing, the line that extends from mux 582 to physical layer 520 is part of command bus 524. Thus, signal patterns injected by CADB 580 can be selected/combined at mux 582 onto command bus 524 for memory device 510.

In one embodiment, CADB 580 is able to provide multiple different types of stress case patterns. Examples of stress cases can include pseudorandom patterns on all lanes, single frequency tone patterns to excite resonances, fixed patterns to support hardware training modes, and fixed patterns where software can control the values on every lane in every cycle independently to find worst case patterns via advanced search techniques. Additionally, in one embodiment, CADB 580 can provide stress case patterns related to victim and aggressor lane traffic. As used herein, an aggressor lane is a lane whose traffic pattern can cause interference (e.g., ISI, crosstalk) on another lane. The lane on which the interference appears can be referred to as the victim lane. CADB 580 can generate traffic to provide one traffic pattern one or more victim lanes while adjacent aggressor lanes get a different pattern, and in one embodiment can automatically rotate the victim lane. Additionally, in one embodiment, CADB 580 can combine resonance patterns and pseudorandom patterns to simultaneously create supply noise and ISI/crosstalk.

In one embodiment, CADB 580 injects traffic on command bus 524 only when the command bus is in a state where the memory controller does not drive the command bus with a valid executable memory device command, or at least does not drive a lane of interest with valid command values. It will be understood that there can be a difference between the memory controller simply not driving the command bus, and the command bus being in a state where it is not driven. The difference can be that the state referred to is invoked, as opposed to the command bus simply being inactive. In one embodiment, CADB 580 can also drive the command bus when it is inactive. However, there are benefits to testing from being able to override all or a portion of the values on the command bus when the memory controller might otherwise be sending command traffic.

In one embodiment, the state referred to is entered when command bus 524 is in a deselect cycle, because a chip select signal is in a state where the memory device is not selected. In one embodiment, memory controller 530 drives a NOP by asserting certain lanes of command bus 524, and the NOP state could be used as the state referred to. In general, use of the expression "deselect state" herein will refer to any state of the command bus where the CADB can inject a test pattern onto the command bus without violating a signaling protocol associated with interconnecting with the memory device.

Figure 5B:
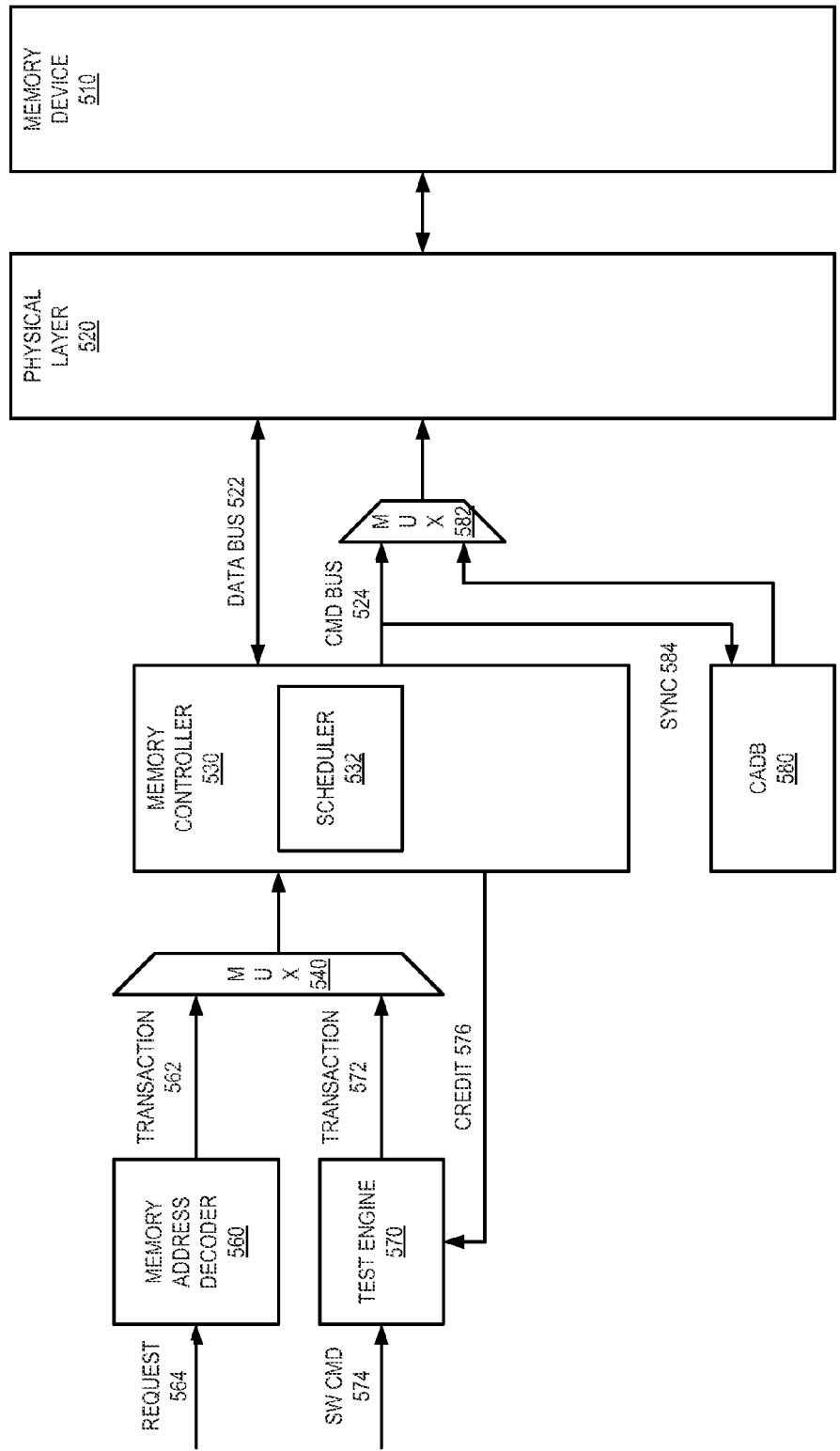
FIG. 5B is a block diagram of an embodiment of a system having a logic buffer coupled to receive synchronization data from the memory controller and provide a signal pattern on the command bus.

FIG. 5B is a block diagram of an embodiment of a system having a logic buffer coupled to receive synchronization data from the memory controller and provide a signal pattern on the command bus. System 504 is equivalent to system 502 of FIG. 5A, with the addition in system 504 of synchronization signal 584 from memory controller 530 to CADB 580. Thus, the description of the components of system 502 apply to those illustrated herein system 504. In one embodiment, synchronization 584 is sent over or as part of command bus 524, but the synchronization signal could be implemented separately from the command bus. Synchronization 584 refer to a trigger to start stress, stop stress, or change a stress pattern. Thus, synchronization 584 can be used to trigger the injecting of a high-stress test signal pattern onto the bus, to cease injecting such a pattern onto the bus, and/or to change the type of signal pattern being injected onto the bus. It will be understood that different synchronization signals can be used to trigger the different types of synchronization.

In one embodiment, addition of synchronization signal 584 enables CADB 580 to drive a signal pattern on command bus 524 during a "select cycle" of the command bus. More particularly, in one embodiment, CADB 580 can provide command bus stress testing including driving continuous patterns (e.g., victim-aggressor traffic) during both select and deselect cycles, synchronizing deselect cycle stress with real data of the command bus patterns as provided by scheduler 532, and/or enabling/disabling deselect cycle stress dynamically during a test.

In one embodiment, CADB 580 can control when a deselect stress patterns is injected onto command bus 524 in response to memory controller 530 producing a deselect cycle. The primary method used to test memory devices (e.g., DRAM) is to write data into the memory device and read it back out to check if it was written correctly. If the same bits fail on a read operation as on a write operation, it is very likely the read data will still match the written data, and the failure will not be detected. By selectively enabling/disabling traffic injecting in deselect cycles (which could be referred to as "deselect stress") at different points during the test, CADB 580 can detect such failures. For example, enabling deselect stress only during read commands and not during write commands can give greater confidence the write operation occurs correctly (due to the lack of stress on the bus), which would give greater confidence in the comparison of read and written data. Additionally or alternatively, deselect stress could be enable during write commands and disabled during read commands to stress test the writes while giving confidence that the read command executes properly. Synchronization 584 can be used to accomplish the enabling/disabling of the deselect stress at the right times, even when scheduler 532 uses a command pipeline (e.g., a command queue).

In one embodiment, synchronization 584 is a signal provided by memory controller 530 or scheduler 532 to CADB 580. In one embodiment, synchronization 584 is a monitoring of command traffic on command bus 524 by CADB 580. For example, CADB 580 can monitor for outgoing commands such as ACT (activate), RD (read), WR (write), or PRE (precharge) as a synchronization signal to control when deselect cycles are enabled or disabled. The exact command that used as a trigger to CADB 580, as well as a delay used between the command and the deselect cycles, can be programmable. In one embodiment, CADB 580 alternatively monitors for an event indicator (e.g., a scheduling event) other than a specific memory device command that has proper timing relative to a command pipeline.

In one embodiment, CADB 580 includes logic to enable it to use different patterns for different lanes. For example, assume two traffic patterns can be generated as selected by PatternSelGen0 and PatternSelGen1. CADB 580 could drive a continuous pattern, such as injecting traffic onto victim lanes with PatternSelGen0 and onto aggressor lanes with PatternSelGen1, during both select and deselect cycles. It will be understood that changing the command bus during a select cycle, when memory device 510 will execute the command sent on the command bus as opposed to a deselect cycle where memory device 510 will ignore at least a portion of the command bus during the cycle, is that the changes can easily create command bus traffic that is illegal from a protocol perspective. In one embodiment, overriding command bus 524 can be performed on portions of the command bus independently. For example, certain lanes or fields of command bus 524 can be overridden with stress test traffic. It will be understood that certain lanes may be easier to override than others. For example, the address could be easier to override than a command signal during a select cycle. As long as the write and read are directed to the same memory address, the exact value of a different lane may be a "don't care." It will be understood that the ease of overriding can apply to the deselect cycle as well as the select cycle, where different lanes can be stressed. For example, it may be desirable to stress a CS# lane while CMD drives a NOP during one test, and a different test could leave CS# deasserted while CMD drives stress traffic. Thus, CADB 580 can check a synchronization signal prior to injecting a signal pattern onto the command bus, and can use the synchronization to control when signal pattern generation occurs or when injecting a signal pattern is performed. Checking the synchronization can be accomplished by using a synchronization signal, static programming, and/or a combination of these.

Figure 6:
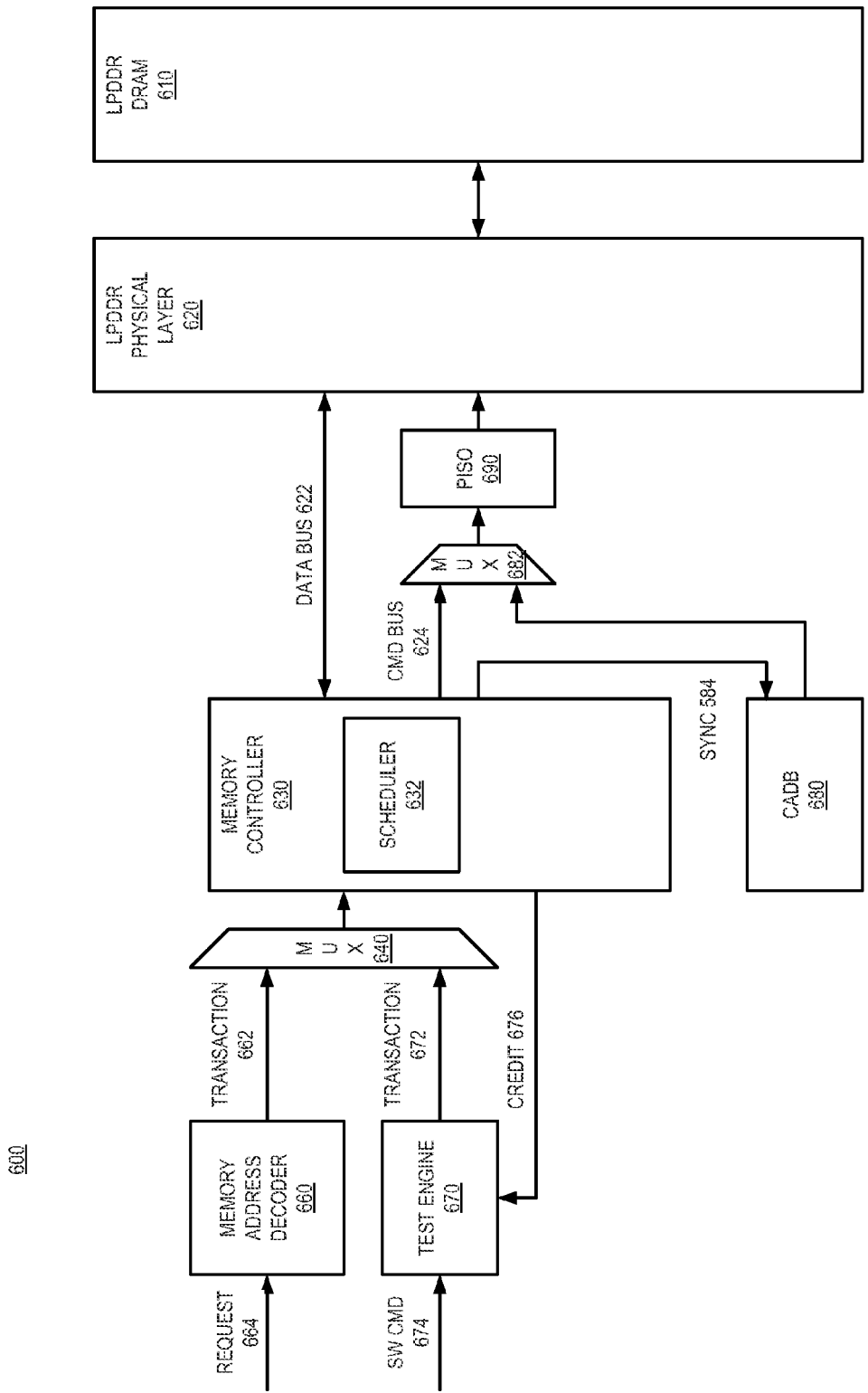
FIG. 6 is a block diagram of an embodiment of a system having a logic buffer coupled to the command bus and a PISO device in the command bus.

FIG. 6 is a block diagram of an embodiment of a system having a logic buffer coupled to the command bus and a PISO device in the command bus. System 600 represents one example of an embodiment of a system in accordance with systems 502 and 504 discussed above. Request 664, memory address decoder 660, transaction 662, software command 674, test engine 670, transaction 672, mux 640, memory controller 630, scheduler 632, CADB 680, mux 682, data bus 622, and command bus 624 are similar to elements discussed above with respect to those systems, and the discussion there applies to these elements of system 600.

In one embodiment, the memory device in system 600 is specifically LPDDR (low power dual data rate) DRAM 610 and supporting LPDDR physical layer 620. Memory controller 630 could be compatible with other DDR memory devices, and also able to interface with LPDDR DRAM 610. LPDDR memory double pumps the command bus as compared to standard DDR DRAM. Thus, with LPDDR DRAM 610, command bus 624 is run at the same frequency as data on data bus 622. In one embodiment, scheduler 632 runs at half the frequency (or potentially even less than half the frequency) of the data bus even though command bus 624 is run at the same frequency. In one embodiment, system 600 includes PISO (parallel in, serial out) device 690 in command bus 624 to properly interface memory controller 630 with LPDDR physical layer 620 and LPDDR DRAM 610.

In one embodiment, CADB 680 includes various pattern generators, and can select which generator or generators are used to generate the signal pattern to inject onto command bus 624. In one embodiment, the pattern selection generators within CADB 680 are run at twice their normal frequency to speed command traffic generation up to a level commensurate with traffic on the command bus at the physical layer (e.g., at the output of PISO 690). For example, CADB 680 could include logic configured to calculate two values per cycle (such as with a high phase value and low phase value). Addressing and counting could also be configured to increment by two instead of one on each cycle. In one embodiment, CADB 680 maps to command pins in a way that parallel communication and pins that are time multiplexed on a single physical pin use different phases from the same pattern selection generator or PatternSelGen. The assignment of pins can take into account the need to correctly assign the use of either high or low phase value based on how PISO 690 time multiplexes the signals together.

Figures 7A, 7B:
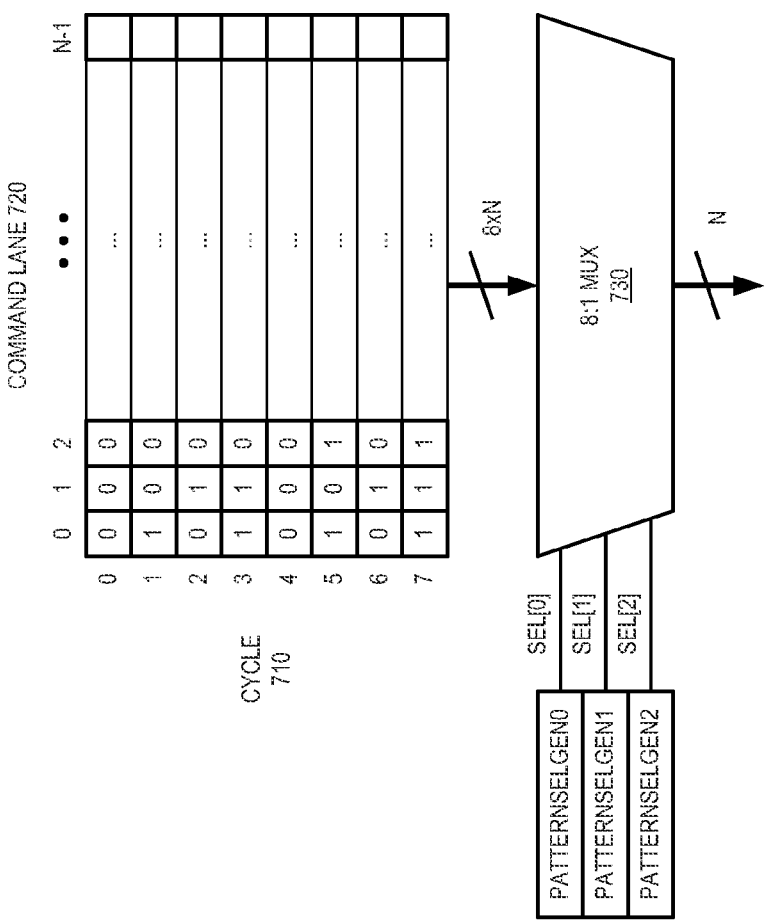
FIG. 7A is a block diagram of an embodiment of a system having a logic buffer with a bit array selected by a chosen pattern generator.
FIG. 7B is a block diagram of an embodiment of pattern selection generator.

FIG. 7A is a block diagram of an embodiment of a system having a logic buffer with a bit array selected by a chosen pattern generator. The logic buffer provides one example embodiment of a CADB in accordance with any embodiment described herein. The logic buffer includes a bit array of M×N bits, where M=8 in the drawing. Other values of M are possible. In one embodiment, N is the width of the command bus. For example, in DDR3, N=34 could provide for the following lanes of the command bus (with the number of bits of each lane represented): RAS#, CAS#, WE#, MA[15:0], BA[2:0], CS[3:0], ODT[3:0], CKE[3:0]. Other values of N are possible. The logic buffer could be dedicated hardware provided to implement the CADB, or it could be implemented as a reuse of existing queue resources. In one embodiment, multiple columns are included in a single lane (e.g., N=2*Lanes, or some other value of Lanes times a number). In one embodiment, multiple lanes share the same column (e.g., N=Lanes/2, or some other value of Lanes divided by a number).

As illustrated, the bit array has rows representing cycle 710 (referring to deselect cycles), and columns representing command lane 720. It will be understood that to select which cycle 710 to use, mux 730 should be triggered with a number Y of select lines where 2^Y is greater than or equal to M. Thus, three PatternSelGen blocks are shown, PatternSelGen0, PatternSelGen1, and PatternSelGen2. It will be understood that the three different PatternSelGen blocks represent different pattern selection logic. In one embodiment, the different pattern selection logic is used to produce combinations of different types of pattern logic, which produces different combinations of bits in the array. The different logic type is explained in more detail below with respect to FIG. 7B. The selection logic, PatternSelGen produces SEL[2:0] to control mux 730. Mux 730 is one embodiment of a parallel to serial mux (PISO). It will be understood that a PISO on the command bus (for example, PISO 690 described above) can be a separate path than mux 730, where the PISO on the command bus affects normal traffic as well as traffic from the CADB or equivalent logic.

As seen, the bit array includes a simple binary sequence for columns 0-2, starting with 000 in row0, and ending with 111 in row7. Other bit array values are possible. There could also be any number of bits sequence patterns in the other lanes of the bit array. The bit array structure could be used with no changes to the bits in the rows to provide M fully programmable command patterns. For example, such a structure could be used during initialization to program Mode Registers. In one embodiment, the bit array is used by search algorithms to attempt to find the worst case pattern by adjusting individual bits.

By adding PatternSelGen logic to Sel[2:0], the logic buffer can operate as a lookup or truth table the encodes a specific Boolean combination of the Sel[2:0] inputs. For example, as shown in the binary sequence of columns 0-2, CMD[0] data (column 0) is programmed to be 1 whenever Sel[0] is 1. Thus, CMD[0] is programmed to always output Sel[0]. Similarly, CMD[1]=Sel[1], and CMD[2]=(Sel[0]&Sel[2]). In general, such a lookup table approach allows any lane to be programmed to generate any Boolean combination of {Sel[0], Sel[1], Sel[2]}. Thus, a single PatternSelGen block can be shared by all lanes and be assigned to any given lane with almost no overhead logic.

FIG. 7B is a block diagram of an embodiment of pattern selection generator. PatternSelGen 740 is one example embodiment of PatterSelGen logic such as used in FIG. 7A. In one embodiment, each PatternSelGen block (e.g., 0, 1, 2) is implemented as PatternSelGen 740, with multiple different logic options for each one. In an alternative embodiment, PatternSelGen 740 is implemented in a more collective fashion than having all logic types repeated for each PatternSelGen. For example, PatternSelGen0, PatternSelGen1, and PatternSelGen2 could be three separate muxes 750, which each have a programmable select signal 752, and all three (or other number) multiplexers are connected to the same logic blocks. In another alternative embodiment, the output of mux 750 could be fed into multiple different logic buffers, and multiple different iterations of pattern selection can be made to generate the select signal (e.g., SEL[2:0]).

PatternSelGen 740 can have multiple different pattern options built into it, depending on the implementation of the test system. Three possible examples are illustrated: LSFR (linear shift feedback register) 762, square wave generator 764, and pattern buffer 766. Other types are possible.

LSFR 762 can generate a pseudorandom pattern with minimal hardware cost. LFSR 762 can use either a fixed or programmable polynomial, depending on implementation. In one embodiment, LFSR 762 has a fixed starting seed, and in another embodiment, LFSR 762 has a programmable starting seed. The programmable aspects can be programmed by the memory controller, or by a test system administrator system. In one embodiment, LSFR 762 is implemented on the same hardware as pattern buffer 766.

Square wave generator 764 can be a FSM (finite state machine) that will generate a digital square wave (e.g., X ones followed by Y zeros) with programmable frequency, phase shift and duty cycle. The programmable aspects can be programmed by the memory controller, or by a test system administrator system. Given that square wave generator 764 can generate a single tone frequency, can be useful at exciting resonance frequencies in the I/O system of the memory subsystem. In one embodiment, a specific resonance frequency is not known precisely. In such a case, square wave generator 764 can be programmed to increment through a range of frequencies (e.g., $f_{START}$ to $f_{STOP}$) and generate a chirp pattern. The chirp can generate a given frequency for a programmable length of time before incrementing to the next value, where the increment could be done in either a linear or exponential fashion.

In one embodiment, pattern buffer 766 can be a rotating shift register programmed with a fixed N-bit long pattern. Thus, the logic buffer can apply a fixed pattern to some lanes without the overhead of needing to program the entire logic buffer or CADB. In a simple case, a programmable shift register can be programmed to walk linearly through all test values.

Figure 8:
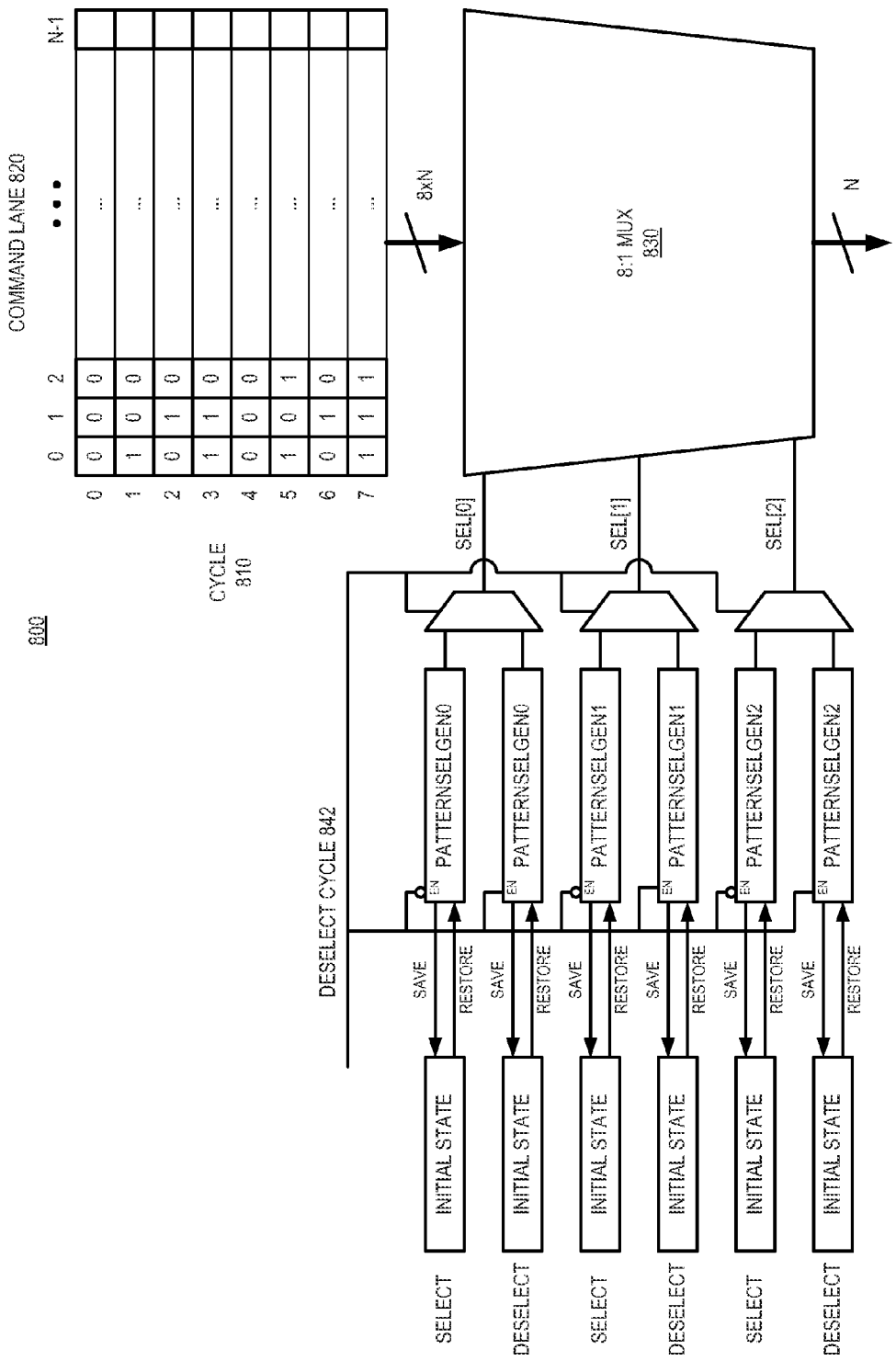
FIG. 8 is a block diagram of an embodiment of a system having a logic buffer with a bit array selected by one of multiple selected pattern generators.

FIG. 8 is a block diagram of an embodiment of a system having a logic buffer with a bit array selected by one of multiple selected pattern generators. System 800 is one example of a logic buffer in accordance with any embodiment described herein. Similar to what is shown in FIGS. 7A and 7B, logic buffer 800 includes a bit array with rows, cycle 810, and with columns, command lane 820. Thus, as illustrated logic buffer 800 includes 8 rows and N columns, but there could be any number of rows needed to implement whatever testing is designed. 8:1 mux 830 (which could alternatively be labeled as an M:1 mux), selects one of the cycles or logical combinations of cycles 810 and outputs it, making an N-bit output to inject onto a command bus.

Many classes of interesting patterns define a victim bit and a group of aggressor bits. As one example, suppose a test used LFSR0 for CMD[0] (victim) and LFSR1 for CMD[9:1] (aggressors). Such a test could be iterated ten times, allowing each lane a chance to be a victim to achieve complete coverage. Iteration of the test could be achieved by either starting/stopping the test to reprogram logic buffer 800, or increasing the size of the logic buffer. It will be understood that in general, logic buffer 800 could have a number of entries equal to (Number of Victim Lanes)*(2^Number of Sel). With a large enough bit array, the test could simply define a starting and stopping location within the blocks and how fast it should increment from one block to the next, where one block is (2^Number of Sel), and represents a single complete victim pattern. For the example described above of testing CMD[9:0], logic buffer 800 could have allocated ten blocks of eight entries each, with the test programmed to assign the appropriate PatternSelGen to the appropriate lane based on the desired victims/aggressor combinations.

In one embodiment, a test seeks to have each lane replay the same pattern sequence multiple times during a test, for example, to achieve uniform coverage of the test. For example, continuing the same example from above, the test could have LFSR0 and LFSR1 start with the same initial seed for each victim lane. In one embodiment, logic buffer 800 periodically saves and restores the PatternSelGen state to be able to replay the same pattern sequence multiple times. PatternSelGen state could include, among other things, LFSR seed value, Pattern Buffer value, and/or Square Wave Generator counter values. Thus, the PatternSelGen could have two copies of its state, both initial and current. The current state is the working copy and can be incremented, for example, during every deselect cycle. In one embodiment, the initial copy is only updated by software before the test starts or during a save operation. In one embodiment, restore overrides the current state with the initial state. Likewise, a save operation can override the initial state with the current state.

Referring more specifically to logic buffer 800, the selection logic is expanded and more complex than what is shown above in FIG. 7A. In one embodiment, each select line (SEL [2:0]) is selected from multiple potential patterns, for example, by a multiplexer. As illustrated, there is a select cycle pattern and a deselect cycle pattern for each of PatternSelGen0, PatternSelGen1, and PatternSelGen2. The different pattern selection blocks can be enabled via a signal deselect cycle 842, which indicates whether or not a deselect cycle has been detected. The same deselect cycle signal 842 can trigger the mux input selection. Thus, the deselect cycle PatternSelGen0 will be selected for SEL[0] when indicated by deselect cycle signal 842, and the select cycle PatternSelGen0 will be selected for SEL[0] otherwise. The same can be true for SEL[1] and SEL[2]. In one embodiment, the pattern selection blocks only increment when they are selected.

In one embodiment, as discussed above, the PatternSelGen blocks can save and restore state to reuse a pattern selection multiple times. A save operation stores a current state of the PatternSelGen block into an associated initial state storage. A restore operation reads the saved state out of the associated initial state storage to be applied within the PatternSelGen block. The determination to save and/or restore can be triggered in logic by test control logic, either from a memory controller, a test engine, or a remote administration source.

Returning to the example above, in one embodiment, the PatternSelGen logic is configured for a particular test or test sequence to restore state every time the logic buffer block increments. In one embodiment, when the logic buffer wraps back to the starting block, the PatternSelGen block can skip the restore operation and replace it with a save operation. Thus, logic buffer 800 could perform a long test that walks through all logic buffer blocks multiple times while still making forward progress through the possible test patterns (e.g., LFSR patterns) while providing identical stress on all victim lanes.

In one embodiment, logic buffer 800 can save and/or restore a PatternSelGen state based on a command (e.g., a synchronization command), instead of, or in addition to saving/restoring state periodically. Thus, logic buffer 800 can save and restore state based on specific commands, similar to turning on/off deselects. The ability to save/restore based on a command can allow the PatternSelGen state to be synchronized with the command traffic on the command bus. By way of example, this would allow the PatternSelGen state to be saved after a specific write command and then restored after a specific read command to ensure that one reads the identical set of addresses as was written. It will be understood that "command" is used here in a generic sense, and could be replaced by any key event in the memory controller that has the proper timing relative to the logic buffer.

As mentioned above, in one embodiment, logic buffer 800 has separate select cycle and deselect cycle PatternSelGen blocks. Having separate select cycle and deselect cycle PatternSelGen blocks can prevent synchronization errors in read and write delay discrepancies. For example, consider the following sequence of events in Table 2. It will be understood that there are delays between the commands, which can be filled in by deselect traffic.

TABLE 2

Example Sequence of Operations

| Command | Address | PatternSelGen Operation |
|---------|---------|------------------------|
| Write | A | Save |
| Write | B | Increment |
| Write | C | Increment |
| Write | D | Increment |
| Read | A | Restore |
| Read | B | Increment |
| Read | C | Increment |
| Read | D | Increment |
| Write | E | Increment & Save |

In one embodiment, the flow of Table 2 would only work if the delays between all the write commands match the delays between all the read commands exactly. Any difference in delays could cause the PatternSelGen blocks to get out of sync. Having separate PatternSelGen blocks for select cycles versus deselect cycles can ensure the exact same sequence of addresses will be used for all the commands even if there are minor protocol timing differences. Such a feature is useful to support cases where write-to-write turnaround time may be different than read-to-read turnaround time. Similarly, if refreshes are enabled and happen in the middle of the sequence of commands, the separate select cycle and deselect cycle PatternSelGen blocks can ensure the use of the correct sequence of addresses.

Figure 9:
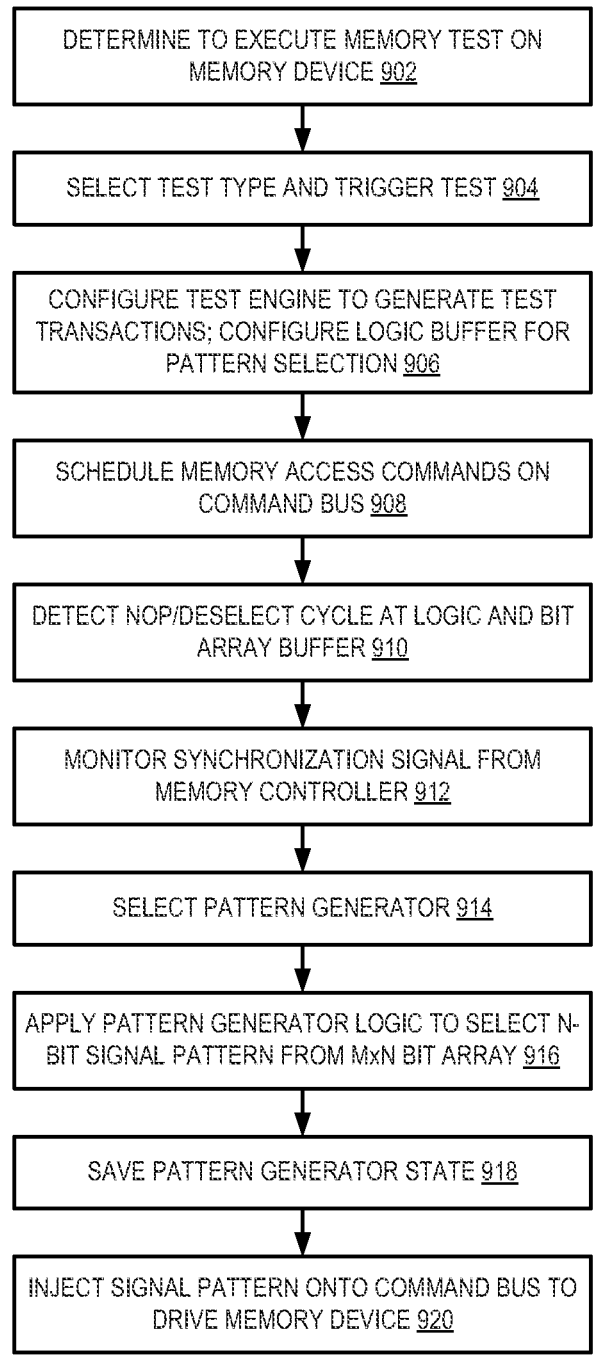
FIG. 9 is a flow diagram of an embodiment of a process for testing a command bus of a memory device.

FIG. 9 is a flow diagram of an embodiment of a process for testing a command bus of a memory device. In one embodiment, a memory source determines to perform a memory test on a memory device, 902. There can be various reasons to perform a test, and various different types of test that can be performed. In one embodiment, the test includes injecting test signals onto a command bus or command/address bus. In one embodiment, the test source selects a type of test to perform, 904. Alternatively, the test engine can determine a test to perform with respect to injecting test signals onto the command bus.

In one embodiment, the test engine can be fully or partially reprogrammed dynamically for a test. In one embodiment, the test engine includes selection mechanisms to select and/or configure hardware for use in the test. Additionally, a logic buffer as described herein can be configured (e.g., configuring a PatternSelGen block or associated logic). Thus, the test source can configure the test engine/logic buffer to generate the desired testing, 906. In one embodiment, the logic buffer and/or the test engine can perform auto-configuration based on software instructions or other signals received from a test source. Configuration can include preparing the hardware and selecting the proper hardware to execute the test. In one embodiment, configuring the test engine hardware includes reprogramming the hardware resources of the test engine.

The memory controller, via its scheduler and command pipeline, can schedule and queue up memory access commands on the command bus based on the test engine transactions generated, 908. In one embodiment, the logic buffer monitors the command bus to detect a deselect condition, such as a deselect cycle, NOP, or other state where the memory controller will not drive a valid command, 910. The logic buffer can be in accordance with any embodiment described herein, and can include a bit array and logic to combine the bits to generate a test signal. In one embodiment, the logic buffer monitors a synchronization signal from a memory controller, 912. In one embodiment, the synchronization signal is a specific command. In one embodiment, the synchronization signal is an indication of a scheduling event.

The logic buffer can select a pattern generator for one or more patterns to use to generate the test signal, 914. In one embodiment, the logic buffer applies the pattern generator logic to select an N-bit signal pattern from an M×N bit array, 916. For example, the logic buffer can include one or more multiplexers to select between various pattern generation hardware units. In one embodiment, the logic buffer saves a state of the pattern generation to be able to reproduce the same pattern at a later time in the test, 918. The logic buffer injects a signal pattern generated from the selected pattern generator onto the command bus to drive the memory device, 920. In one embodiment, the signal pattern is the entire width of the command bus. In an alternative embodiment, the signal pattern is only one or more fields of the command bus, which can be referred to as command lanes. Thus, the logic buffer can generate command bus traffic to test the memory device and the physical layer interfacing the memory device to the memory controller.

Figure 10:
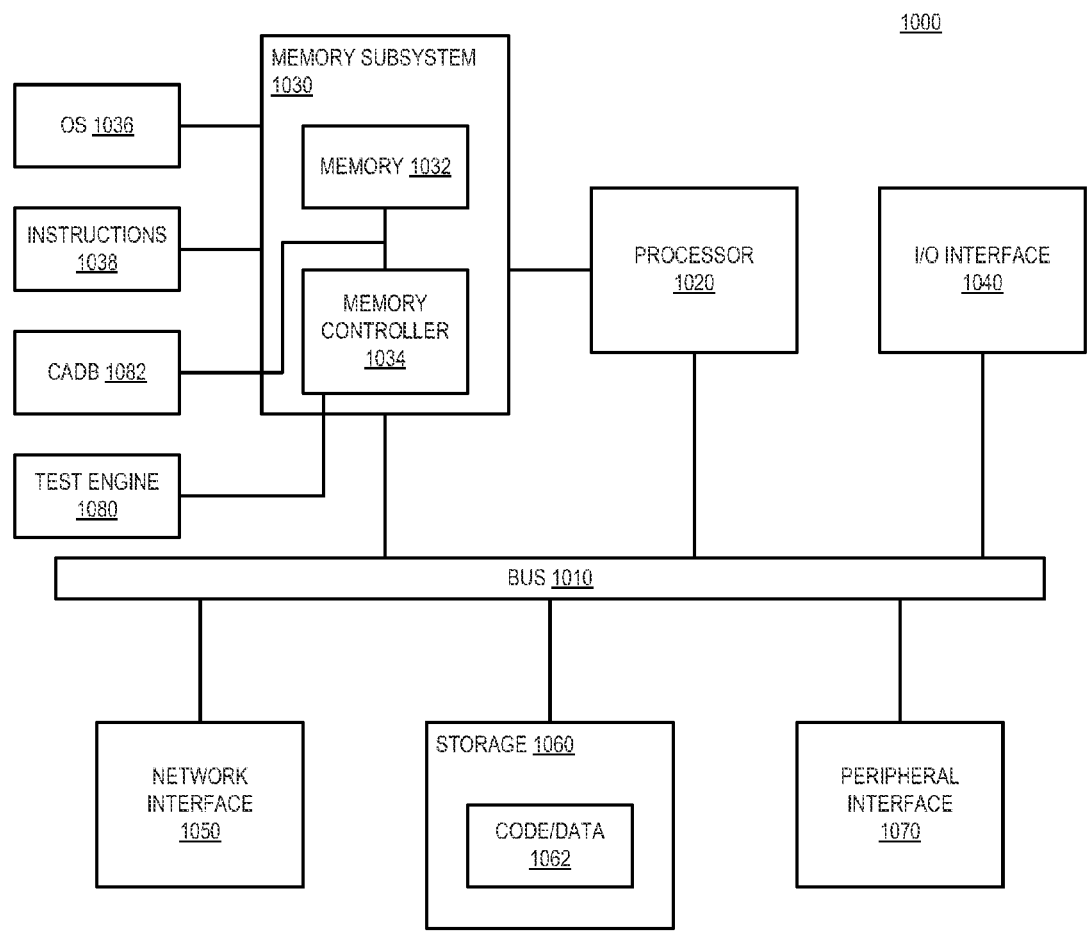
FIG. 10 is a block diagram of an embodiment of a computing system in which command bus testing can be implemented.

FIG. 10 is a block diagram of an embodiment of a computing system in which command bus testing can be implemented. System 1000 represents a computing device in accordance with any embodiment described herein, and can be a laptop computer, a desktop computer, a server, a gaming or entertainment control system, a scanner, copier, printer, routing or switching device, or other electronic device. System 1000 includes processor 1020, which provides processing, operation management, and execution of instructions for system 1000. Processor 1020 can include any type of microprocessor, central processing unit (CPU), processing core, or other processing hardware to provide processing for system 1000. Processor 1020 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 1030 represents the main memory of system 1000, and provides temporary storage for code to be executed by processor 1020, or data values to be used in executing a routine. Memory subsystem 1030 can include one or more memory devices such as read-only memory (ROM), flash memory, one or more varieties of random access memory (RAM), or other memory devices, or a combination of such devices. Memory subsystem 1030 stores and hosts, among other things, operating system (OS) 1036 to provide a software platform for execution of instructions in system 1000. Additionally, other instructions 1038 are stored and executed from memory subsystem 1030 to provide the logic and the processing of system 1000. OS 1036 and instructions 1038 are executed by processor 1020.

Memory subsystem 1030 includes memory device 1032 where it stores data, instructions, programs, or other items. In one embodiment, memory subsystem includes memory controller 1034, which is a memory controller in accordance with any embodiment described herein, and which includes a scheduler to generate and issue commands to memory device 1032.

In one embodiment, system 1000 includes test engine 1080, which provides memory test transactions to memory controller 1034 to have memory controller 1034 schedule the transactions in order to provide deterministic testing. Thus, test engine 1080 enables transaction-level memory testing of memory 1032 in accordance with any embodiment described herein. In one embodiment, system 1000 includes CADB 1082 connected to a command bus. CADB 1082 can generate and inject signal patterns onto the command bus, in accordance with any embodiment described herein.

Processor 1020 and memory subsystem 1030 are coupled to bus/bus system 1010. Bus 1010 is an abstraction that represents any one or more separate physical buses, communication lines/interfaces, and/or point-to-point connections, connected by appropriate bridges, adapters, and/or controllers. Therefore, bus 1010 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 1010 can also correspond to interfaces in network interface 1050.

System 1000 also includes one or more input/output (I/O) interface(s) 1040, network interface 1050, one or more internal mass storage device(s) 1060, and peripheral interface 1070 coupled to bus 1010. I/O interface 1040 can include one or more interface components through which a user interacts with system 1000 (e.g., video, audio, and/or alphanumeric interfacing). Network interface 1050 provides system 1000 the ability to communicate with remote devices (e.g., servers, other computing devices) over one or more networks. Network interface 1050 can include an Ethernet adapter, wireless interconnection components, USB (universal serial bus), or other wired or wireless standards-based or proprietary interfaces.

Storage 1060 can be or include any conventional medium for storing large amounts of data in a nonvolatile manner, such as one or more magnetic, solid state, or optical based disks, or a combination. Storage 1060 holds code or instructions and data 1062 in a persistent state (i.e., the value is retained despite interruption of power to system 1000). Storage 1060 can be generically considered to be a "memory,"

although memory 1030 is the executing or operating memory to provide instructions to processor 1020. Whereas storage 1060 is nonvolatile, memory 1030 can include volatile memory (i.e., the value or state of the data is indeterminate if power is interrupted to system 1000).

Peripheral interface 1070 can include any hardware interface not specifically mentioned above. Peripherals refer generally to devices that connect dependently to system 1000. A dependent connection is one where system 1000 provides the software and/or hardware platform on which operation executes, and with which a user interacts.

Figure 11:
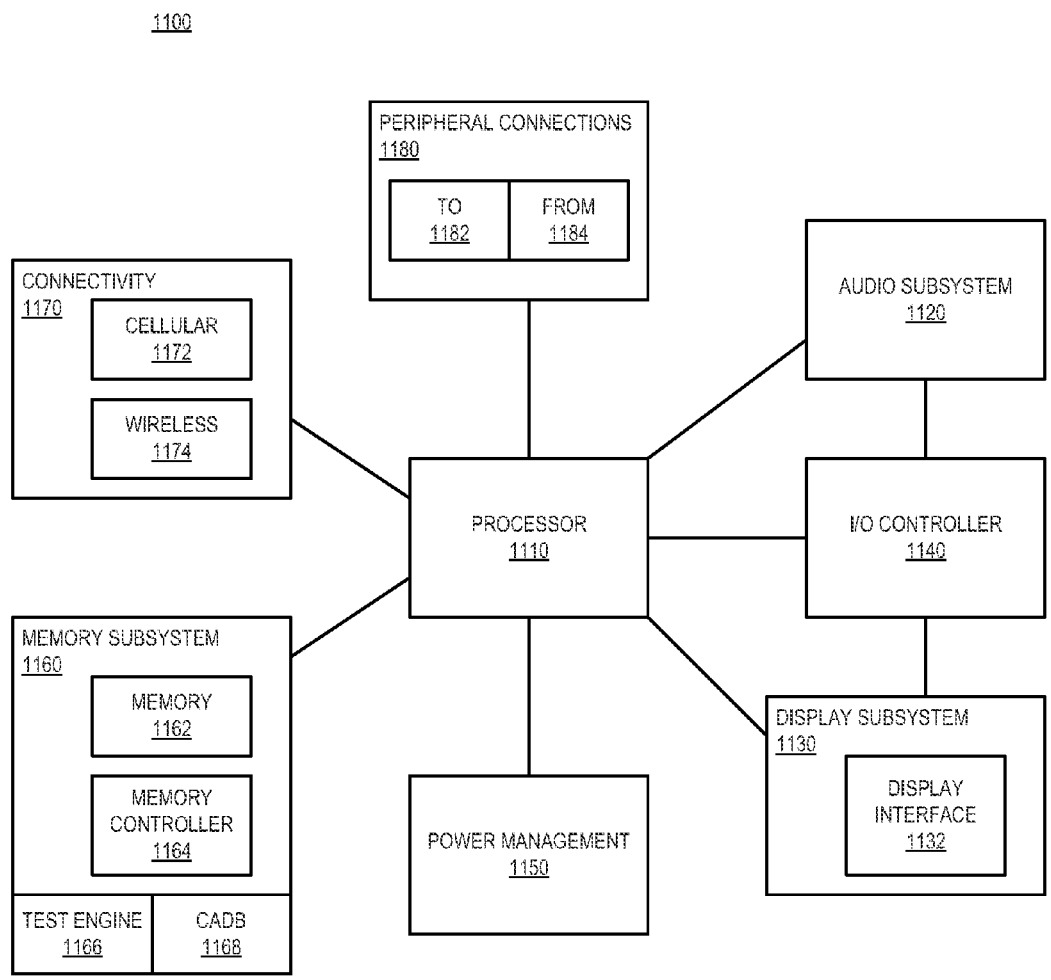
FIG. 11 is a block diagram of an embodiment of a mobile device in which command bus testing can be implemented.

FIG. 11 is a block diagram of an embodiment of a mobile device in which command bus testing can be implemented. Device 1100 represents a mobile computing device, such as a computing tablet, a mobile phone or smartphone, a wireless-enabled e-reader, or other mobile device. It will be understood that certain of the components are shown generally, and not all components of such a device are shown in device 1100.

Device 1100 includes processor 1110, which performs the primary processing operations of device 1100. Processor 1110 can include one or more physical devices, such as microprocessors, application processors, microcontrollers, programmable logic devices, or other processing means. In one embodiment, processor 1110 includes optical interface components in addition to a processor die. Thus, the processor die and photonic components are in the same package. Such a processor package can interface optically with an optical connector in accordance with any embodiment described herein.

The processing operations performed by processor 1110 include the execution of an operating platform or operating system on which applications and/or device functions are executed. The processing operations include operations related to I/O (input/output) with a human user or with other devices, operations related to power management, and/or operations related to connecting device 1100 to another device. The processing operations can also include operations related to audio I/O and/or display I/O.

In one embodiment, device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1100, or connected to device 1100. In one embodiment, a user interacts with device 1100 by providing audio commands that are received and processed by processor 1110.

Display subsystem 1130 represents hardware (e.g., display devices) and software (e.g., drivers) components that provide a visual and/or tactile display for a user to interact with the computing device. Display subsystem 1130 includes display interface 1132, which includes the particular screen or hardware device used to provide a display to a user. In one embodiment, display interface 1132 includes logic separate from processor 1110 to perform at least some processing related to the display. In one embodiment, display subsystem 1130 includes a touchscreen device that provides both output and input to a user.

I/O controller 1140 represents hardware devices and software components related to interaction with a user. I/O controller 1140 can operate to manage hardware that is part of audio subsystem 1120 and/or display subsystem 1130. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one embodiment, I/O controller 1140 manages devices such as accelerometers, cameras, light sensors or other environmental sensors, gyroscopes, global positioning system (GPS), or other hardware that can be included in device 1100. The input can be part of direct user interaction, as well as providing environmental input to the system to influence its operations (such as filtering for noise, adjusting displays for brightness detection, applying a flash for a camera, or other features).

In one embodiment, device 1100 includes power management 1150 that manages battery power usage, charging of the battery, and features related to power saving operation. Memory subsystem 1160 includes memory device(s) 1162 for storing information in device 1100. Memory subsystem 1160 can include nonvolatile (state does not change if power to the memory device is interrupted) and/or volatile (state is indeterminate if power to the memory device is interrupted) memory devices. Memory 1160 can store application data, user data, music, photos, documents, or other data, as well as system data (whether long-term or temporary) related to the execution of the applications and functions of system 1100.

In one embodiment, memory subsystem 1160 includes memory controller 1164 (which could also be considered part of the control of system 1100, and could potentially be considered part of processor 1110). Memory controller 1164 includes a scheduler to generate and issue commands to memory device 1162. In one embodiment, test engine 1166 is coupled to or part of memory subsystem 1160, and provides memory test transactions to memory controller 1164. The test transactions can cause memory controller 1164 to schedule the transactions to provide deterministic testing of memory device 1162. Test engine 1166 enables transaction-level memory testing in memory subsystem 1160 in accordance with any embodiment described herein. In one embodiment, system 1000 includes CADB 1168, which is a logic buffer connected to a command bus of memory subsystem 1160. CADB 1168 can generate and inject signal patterns onto the command bus, in accordance with any embodiment described herein.

Connectivity 1170 includes hardware devices (e.g., wireless and/or wired connectors and communication hardware) and software components (e.g., drivers, protocol stacks) to enable device 1100 to communicate with external devices. The device could be separate devices, such as other computing devices, wireless access points or base stations, as well as peripherals such as headsets, printers, or other devices.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications)

or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading and/or uploading, changing, synchronizing) content on device 1100. Additionally, a docking connector can allow device 1100 to connect to certain peripherals that allow device 1100 to control content output, for example, to audiovisual or other systems.

In addition to a proprietary docking connector or other proprietary connection hardware, device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a memory subsystem includes a memory device to store data and execute memory device commands to access and manage the data; a memory controller coupled to the memory device via a data bus and via a command bus, the memory controller to drive the command bus with memory device commands; and a buffer coupled to the command bus, the buffer including logic to detect that the at least a portion of the command bus is in a state where the memory controller does not drive the portion with a valid executable memory device command, generate a signal pattern in response to detecting the state, the signal pattern generated based on the detected state, and inject the signal pattern on the command bus after a scheduler of the memory controller to drive the portion of the command bus with the signal pattern.

In one embodiment, the buffer logic is to detect a deselect cycle. In one embodiment, the buffer logic is to detect a no operation (NOP) command. In one embodiment, the buffer logic is to detect a select cycle where at least a portion of the command bus is driven with a valid executable memory device command. In one embodiment, the buffer logic is to override at least a portion of the command bus driven with a valid executable memory device command to drive the portion with the signal pattern. In one embodiment, the portion comprises one or more fields of a command signal not used for a particular command on the command bus. In one embodiment, the portion of the command signal comprises a specific command field.

In one embodiment, the buffer logic is to further check a synchronization signal to control when to generate the signal pattern. In one embodiment, the buffer logic is to further monitor the command bus for valid executable commands and synchronize to the valid executable commands, and when the portion of the command bus does not include a valid executable command, the buffer logic is to inject the signal pattern onto the portion of the bus to keep the bus full. In one embodiment, the buffer logic is to save and restore a signal pattern selection state based on the synchronization signal. In one embodiment, the synchronization signal comprises a signal from the scheduler. In one embodiment, the synchronization signal comprises a signal from the memory controller or a signal from a test engine coupled to the memory controller. In one embodiment, the synchronization signal comprises one or more specific memory device commands.

In one embodiment, the buffer logic is to generate the signal pattern by selecting bits of an M×N buffer array of bits to drive the portion of the command bus. In one embodiment, N is a number of bits equal to a width of the command bus. In one embodiment, the buffer logic is to apply Y-bit selection logic that generates a Boolean combination of bits of the buffer array, where $2^Y$ is a number equal to or greater than M, to select from M rows of N bits. In one embodiment, each bit of the Y-bit selection logic is associated with a different pattern type. In one embodiment, the buffer logic is to generate different signal patterns based on whether the detected state is a select cycle where at least a portion of the command signal is driven with a valid executable memory device command, or a deselect cycle where no portion of the command signal is driven with a valid executable memory device command. In one embodiment, the buffer logic further includes select cycle pattern generation logic and separate deselect cycle pattern generation logic, and is to generate the different signal patterns with the separate pattern generation logic based on whether the buffer logic detects a select cycle or a deselect cycle.

In one embodiment, the memory controller drives the command bus at a same rate as a data bus between the memory controller and the memory device, and wherein generating the signal pattern further comprises running pattern selection hardware at a double rate to perform multiple operations of pattern generation per clock cycle. In one embodiment, the buffer logic is to provide even and odd signal patterns to specific lanes of the command bus corresponding to how the lanes are combined in a parallel-in, serial-out logic device. In one embodiment, the buffer logic further includes different pattern generators to generate signal patterns of different types, the different types of signal patterns selected from a linear shift feedback register (LSFR), a square wave generator, or a pattern buffer.

In one aspect, an electronic device includes a memory subsystem including a memory device to store data and execute memory device commands to access and manage the data; a memory controller coupled to the memory device via a data bus and via a command bus, the memory controller to drive the command bus with memory device commands; and a buffer coupled to the command bus, the buffer including logic to detect that the at least a portion of the command bus is in a state where the memory controller does not drive the portion with a valid executable memory device command, generate a signal pattern in response to detecting the state, the signal pattern generated based on the detected state, and inject the signal pattern on the command bus after a scheduler of the memory controller to drive the portion of the command bus with the signal pattern; and a touchscreen display coupled to generate a display based on data stored in the memory subsystem.

Any of the various embodiments above with respect to the memory subsystem can also apply to the memory subsystem of the electronic device.

In one aspect, a method includes detecting that at least a portion of command signal on a command bus between a memory controller and a memory device is in a state where the memory controller does not drive the portion with a valid executable memory device command; generating a signal pattern in response to detecting the state, the signal pattern generated based on the detected state; and injecting the signal pattern on the command bus after a scheduler of the memory controller to drive the portion of the command bus with the signal pattern.

In one embodiment, detecting the state comprises detecting one of a select cycle where at least a portion of the command bus is driven with a valid executable memory device command, a deselect cycle, or a no operation (NOP) command. In one embodiment, detecting the state further comprises: checking a synchronization signal received from the scheduler to control when the generating the signal pattern occurs. In one embodiment, generating the signal pattern comprises: generating the signal pattern by selecting bits of an M×N buffer array of bits to drive the portion of the command bus.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory subsystem comprising:
   a memory device to store data and execute memory device commands to access and manage the data;
   a memory controller coupled to the memory device via a data bus and via a command bus, the memory controller to drive the command bus with memory device commands; and
   a buffer coupled to the command bus, the buffer including logic to detect that the at least a portion of the command bus is in a state where the memory controller has not driven the at least a portion with a valid executable memory device command, generate a signal pattern in response to detecting the state, the signal pattern generated based on the detected state, and inject the signal pattern on the command bus through a multiplexer to drive the at least a portion of the command bus with the signal pattern, the multiplexer having an output coupled to the command bus, a first input coupled to the memory controller and a second input coupled to the buffer, the multiplexer to select between memory device commands generated by the memory controller and signal patterns generated by the buffer.

2. The memory subsystem of claim 1, wherein the buffer logic is to detect a deselect cycle.

3. The memory subsystem of claim 1, wherein the buffer logic is to detect a no operation (NOP) command.

4. The memory subsystem of claim 1, wherein the buffer logic is to detect a select cycle where at least a portion of the command bus is driven with a valid executable memory device command.

5. The memory subsystem of claim 4, wherein the buffer logic is to override at least a portion of the command bus driven with a valid executable memory device command to drive the portion with the signal pattern.

6. The memory subsystem of claim 1, wherein the portion comprises one or more fields of a command signal not used for a particular command on the command bus.

7. The memory subsystem of claim 1, wherein the portion of the command signal comprises a specific command field.

8. The memory subsystem of claim 1, wherein the buffer logic is to further check a synchronization signal to control when to generate the signal pattern.

9. The memory subsystem of claim 8, wherein the buffer logic is to further monitor the command bus for valid executable commands and synchronize to the valid executable commands, and when the portion of the command bus does not include a valid executable command, the buffer logic is to inject the signal pattern onto the portion of the bus to keep the bus full.

10. The memory subsystem of claim 8, wherein the buffer logic is to save and restore a signal pattern selection state based on the synchronization signal.

11. The memory subsystem of claim 8, wherein the synchronization signal comprises a signal from the scheduler.

12. The memory subsystem of claim 8, wherein the synchronization signal comprises a signal from the memory controller or a signal from a test engine coupled to the memory controller.

13. The memory subsystem of claim 8, wherein the synchronization signal comprises one or more specific memory device commands.

14. The memory subsystem of claim 1, wherein the buffer logic is to generate the signal pattern by selecting bits of an M×N buffer array of bits to drive the portion of the command bus.

15. The memory subsystem of claim 14, wherein N is a number of bits equal to a width of the command bus.

16. The memory subsystem of claim 14, wherein the buffer logic is to apply Y-bit selection logic that generates a Boolean combination of bits of the buffer array, where 2^Y is a number equal to or greater than M, to select from M rows of N bits.

17. The memory subsystem of claim 16, wherein each bit of the Y-bit selection logic is associated with a different pattern type.

18. The memory subsystem of claim 1, wherein the buffer logic is to generate different signal patterns based on whether the detected state is a select cycle where at least a portion of the command signal is driven with a valid executable memory device command, or a deselect cycle where no portion of the command signal is driven with a valid executable memory device command.

19. The memory subsystem of claim 18, wherein the buffer logic further includes select cycle pattern generation logic and separate deselect cycle pattern generation logic, and is to generate the different signal patterns with the separate pattern generation logic based on whether the buffer logic detects a select cycle or a deselect cycle.

20. The memory subsystem of claim 1, wherein the memory controller drives the command bus at a same rate as a data bus between the memory controller and the memory device, and wherein generating the signal pattern further comprises running pattern selection hardware at a double rate to perform multiple operations of pattern generation per clock cycle.

21. The memory subsystem of claim 20, wherein the buffer logic is to provide even and odd signal patterns to specific lanes of the command bus corresponding to how the lanes are combined in a parallel-in, serial-out logic device.

22. The memory subsystem of claim 1, wherein the buffer logic further includes different pattern generators to generate signal patterns of different types, the different types of signal patterns selected from a linear shift feedback register (LSFR), a square wave generator, or a pattern buffer.

23. An electronic device comprising:
a memory subsystem including
   a memory device to store data and execute memory device commands to access and manage the data;
   a memory controller coupled to the memory device via a data bus and via a command bus, the memory controller to drive the command bus with memory device commands; and
   a buffer coupled to the command bus, the buffer including logic to detect that the at least a portion of the command bus is in a state where the memory controller has not driven the at least a portion with a valid executable memory device command, generate a signal pattern in response to detecting the state, the signal pattern generated based on the detected state, and inject the signal pattern on the command bus through a multiplexer to drive the at least a portion of the command bus with the signal pattern, the multiplexer having an output coupled to the command bus, a first input coupled to the memory controller and a second input coupled to the buffer, the multiplexer to select between memory device commands generated by the memory controller and signal patterns generated by the buffer; and
a touchscreen display coupled to generate a display based on data stored in the memory subsystem.

24. The electronic device of claim 23, wherein the buffer logic is to detect one of a select cycle where at least a portion of the command bus is driven with a valid executable memory device command, a deselect cycle, or a no operation (NOP) command.

25. The electronic device of claim 23, wherein the buffer logic is to further check a synchronization signal to control when to generate the signal pattern.

26. The electronic device of claim 23, wherein the buffer logic is to generate the signal pattern by selecting bits of an M×N buffer array of bits to drive the portion of the command bus.

27. A method comprising:
generating memory device commands with a memory controller;
passing the memory device commands through a multiplexer onto a memory device command bus that resides between the multiplexer and a memory device
detecting that at least a portion of a command signal on the command bus is in a state where the memory controller does not drive the portion with a valid executable memory device command;
generating a signal pattern in response to detecting the state, the signal pattern generated based on the detected state; and
injecting the signal pattern through the multiplexer and onto the command bus to drive the at least a portion of the command bus with the signal pattern.

28. The method of claim 27, wherein detecting the state comprises detecting one of a select cycle where at least a portion of the command bus is driven with a valid executable memory device command, a deselect cycle, or a no operation (NOP) command.

29. The method of claim 27, wherein detecting the state further comprises:
checking a synchronization signal received from the scheduler to control when the generating the signal pattern occurs.

30. The method of claim 27, wherein generating the signal pattern comprises:
generating the signal pattern by selecting bits of an M×N buffer array of bits to drive the portion of the command bus.

* * * * *